(12) United States Patent
Ehmann et al.

(10) Patent No.: US 11,139,759 B2
(45) Date of Patent: Oct. 5, 2021

(54) APPARATUS FOR AT LEAST ONE OF HOLDING, POSITIONING AND MOVING AN OBJECT AND METHOD OF OPERATING AN APPARATUS FOR AT LEAST ONE OF HOLDING, POSITIONING AND MOVING AN OBJECT

(71) Applicants: Christian Wolfgang Ehmann, Darmstadt (DE); Britta Späh, Deidesheim (DE); Martin Aenis, Darmstadt (DE); Timo Adler, Gernsheim (DE); Applied Materials, Inc., Santa Clara, CA (US)

(72) Inventors: Christian Wolfgang Ehmann, Darmstadt (DE); Britta Späh, Deidesheim (DE); Martin Aenis, Darmstadt (DE); Timo Adler, Gernsheim (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/762,052

(22) PCT Filed: Aug. 29, 2017

(86) PCT No.: PCT/EP2017/071651
§ 371 (c)(1),
(2) Date: Mar. 21, 2018

(87) PCT Pub. No.: WO2018/166640
PCT Pub. Date: Sep. 20, 2018

(65) Prior Publication Data
US 2020/0244192 A1    Jul. 30, 2020

(30) Foreign Application Priority Data

Mar. 16, 2017 (DE) ........................ 102017002542.8

(51) Int. Cl.
*H02N 15/00* (2006.01)
*H01L 21/68* (2006.01)
(Continued)

(52) U.S. Cl.
CPC ......... *H02N 15/00* (2013.01); *F16C 32/0472* (2013.01); *H01L 21/68* (2013.01);
(Continued)

(58) Field of Classification Search
CPC ...... H02N 15/00; H01L 21/68; H02K 41/033; H02K 7/09; H02K 2201/18; F16C 32/0472
(Continued)

(56) References Cited

U.S. PATENT DOCUMENTS 2,977,043 A * 3/1961 Scheldorf ............. F04B 39/127
417/363
4,244,629 A * 1/1981 Habermann ............ F16F 15/03
310/90.5
(Continued)

FOREIGN PATENT DOCUMENTS

DE    102004020605 A1    11/2005
DE    102014005897 B3    9/2015
(Continued)

OTHER PUBLICATIONS

International Search Report and Written Opinion dated Dec. 1, 2017 for Application No. PCT/EP2017/071651.
(Continued)

*Primary Examiner* — John K Kim
(74) *Attorney, Agent, or Firm* — Patterson + Sheridan, LLP

(57) ABSTRACT

An apparatus for holding, positioning and/or moving an object is described. The apparatus includes a base, and a carrier which is movable relative to the base. The apparatus
(Continued)

further includes at least three magnetic bearings, by means of which the carrier is supported on the base in a contactless manner such that the carrier can be displaced with respect to at least one predefined direction, wherein at least two of the magnetic bearings are configured as actively controllable magnetic bearings. The apparatus has at least one damping unit, which is fixed to the carrier or to the base.

19 Claims, 10 Drawing Sheets

(51) Int. Cl.
*H02K 41/03* (2006.01)
*H02K 7/09* (2006.01)
*F16C 32/04* (2006.01)

(52) U.S. Cl.
CPC ............ *H02K 7/09* (2013.01); *H02K 41/033* (2013.01); *H02K 2201/18* (2013.01)

(58) Field of Classification Search
USPC .............................................. 310/12.16, 90.5
See application file for complete search history.

(56) References Cited

U.S. PATENT DOCUMENTS

| | | | |
|---|---|---|---|
| 4,550,655 A * | 11/1985 | Haas, Sr. ............... | A21C 15/02 198/625 |
| 4,947,067 A * | 8/1990 | Habermann ........... | F16F 7/1011 244/170 |
| 5,294,854 A * | 3/1994 | Trumper ................ | B82Y 15/00 |
| 5,394,044 A * | 2/1995 | Yamamura ............. | F16C 27/00 310/36 |
| 5,749,444 A | 5/1998 | Skalski | |
| 6,283,041 B1 | 9/2001 | Ono | |
| 6,566,775 B1 * | 5/2003 | Fradella ............... | F16C 32/0442 310/74 |
| 6,794,777 B1 * | 9/2004 | Fradella ............... | F16C 32/0457 310/68 B |
| 8,531,071 B2 * | 9/2013 | Klusman ............... | F16C 17/024 310/90.5 |
| 9,404,556 B2 * | 8/2016 | Swann .................... | F16F 15/18 |
| 10,465,557 B2 * | 11/2019 | Copeland .............. | F16C 27/045 |
| 2008/0029368 A1 | 2/2008 | Komori | |
| 2011/0156394 A1* | 6/2011 | Klusman ............... | F16C 17/024 290/52 |
| 2014/0202812 A1 | 7/2014 | Hauf | |

FOREIGN PATENT DOCUMENTS

| | | | |
|---|---|---|---|
| EP | 0648698 | A1 | 4/1995 |
| JP | H06218690 | A | 8/1994 |
| JP | H11231079 | A | 8/1999 |
| JP | H11294520 | A | 10/1999 |
| JP | 3544208 | B2 | 7/2004 |
| JP | 2005030486 | A | 2/2005 |
| JP | 2007071238 | A | 3/2007 |
| JP | 2012094864 | A | 5/2012 |
| JP | 2012104862 | A | 5/2012 |
| JP | 2014135519 | A | 7/2014 |
| JP | 2014529043 | A | 10/2014 |
| WO | 2015162177 | A1 | 10/2015 |

OTHER PUBLICATIONS

German Office Action dated Mar. 9, 2018 for Application No. 102017002542.8.
Taiwan Office Action dated Dec. 4, 2018 for Application No. 107108496.
Japanese Office Action dated Jun. 4, 2019 for Application No. 2018-516839.
Japanese Office Action dated Jun. 15, 2021 for Application No. 2020-097426.

* cited by examiner

A-A

A-A

APPARATUS FOR AT LEAST ONE OF HOLDING, POSITIONING AND MOVING AN OBJECT AND METHOD OF OPERATING AN APPARATUS FOR AT LEAST ONE OF HOLDING, POSITIONING AND MOVING AN OBJECT

TECHNICAL FIELD

Embodiments of the present disclosure relate to an apparatus for holding, positioning and/or moving an object, in particular substrates. More specifically, a magnetic 10 levitation system configured to contactlessly hold, position and/or move an object in a vacuum chamber is described. Embodiments further relate to a base of an apparatus for holding, positioning and/or moving an object. Yet further, methods of operating an apparatus for holding, positioning and/or moving an object are described.

BACKGROUND

For the processing of substrates for producing semiconductor components, such as for display applications, comparatively large-area substrates undergo various types of surface treatment processes. For example, the surfaces of these substrates are mechanically or chemically treated, in order, for example, to form coatings or surface structures on the substrate. Some surface treatment processes are carried out under clean room conditions or even in a vacuum, in particular when surface treatment processes such as sputtering, physical vapor deposition or chemical vapor deposition, possibly also plasma-supported, have to be carried out.

Since structures in the micron or even nanometer range sometimes have to be formed on the substrates, an extremely precise positioning of these substrates is beneficial, both in the plane of the substrate and normal to said plane.

The requirements with regard to particle freedom of the substrate environment make it beneficial to implement a contactless mounting of the substrate and of a corresponding holding, positioning and/or displacement drive. Air bearings are only suitable for high-purity production environments in certain conditions, since they can cause unwanted air currents in the vicinity of the substrate which can sometimes hinder the maintenance of the accuracies in the substrate treatment.

So-called magnetic wafer stages, or magnetic holding or positioning apparatuses, also exist having a base and a carrier which supports an object. To provide the contactless mounting of the carrier on the base, a plurality of magnetic bearings each with a distance sensor and a control circuit are typically provided, which hold the carrier at a specified distance from the base in a suspended state.

The implementation of actively controlled, and therefore electrically controllable, magnetic bearings, in particular in a vacuum environment, proves to be extremely complex.

For applications in the field of vacuum technology, sufficiently vacuum-compatible materials, in particular metals, are used as component parts and for components of the housing. This can adversely affect the magnetic operation of individual magnetic bearings, however. The electrical control of electromagnetic actuators can lead to the formation of eddy currents in metal components, which can impair the operation of one or more magnetic bearings.

In the case of a magnetic and contactless mounting of the carrier on the base via a plurality of actively controlled magnetic bearings, vibration and resonance phenomena can occur. With a contactless mounting of the carrier using a plurality of actively controlled magnetic bearings, vibrations of the carrier and/or of the base can be stimulated, which are difficult to overcome purely by control engineering techniques.

Due to the contactless mounting of the carrier on the base, the carrier can undergo so-called rigid-body vibrations. Due to the magnetic contactless support however, the carrier can also be excited into elastic resonant vibrations, wherein the carrier is subject to certain elastic deformations. To obtain a highly precise positioning of the carrier on the base, these deformations should also be taken into account. The carrier should no longer be considered a rigid object, but the carrier undergoes inherent vibrations and vibration-related deformations. These can be caused by the contactless mounting of the carrier using the magnetic bearings.

An objective of the present disclosure is therefore to provide an improved apparatus for holding, positioning and/or moving an object using magnetic bearings, with which unavoidable vibrations of the carrier and/or of the base can be better controlled or can be largely eliminated. A further objective is to reduce vibrations and resonances of the carrier at the base, or to minimize the effect of vibrations on the actively controlled magnetic bearings, using simple, vacuum-capable, robust and universally usable means.

SUMMARY

In light of the above, an apparatus for holding, positioning and/or moving an object is provided. Further, a base of an apparatus for holding, positioning and/or moving an object is provided. Yet further, a method of operating an apparatus for holding, positioning and/or moving an object is provided. Advantageous designs are the subject matter of dependent claims.

According to an aspect of the present disclosure, an apparatus for holding, positioning and/or moving an object is provided. The apparatus includes a base and a carrier, which is movable relative to the base. The apparatus further includes magnetic bearings for contactlessly holding the carrier at the base, at least two of the magnetic bearings being configured as actively controllable magnetic bearings. The carrier may be contactlessly held at the base such as to be displaceable in a transport direction. The apparatus includes at least one damping unit, which is fixed to the carrier or to the base.

In some embodiments, the damping unit is a mechanical damping unit. In some embodiments, the damping unit includes a tuned or tunable damper, particularly a mass damper or a vibration damper.

In some embodiments, the damping unit includes a passive damping unit, a semi-active damping unit, and/or an active damping unit, or a combination thereof.

In some embodiments, at least one damping unit is fixed to the carrier. Alternatively or additionally, at least one damping unit is fixed to the base.

In some embodiments, the carrier can be excited into vibration at a fundamental frequency, and the at least one damping unit has a damping ratio D of at least 0.1.

According to a further aspect of the present disclosure, an apparatus for holding, positioning and/or moving an object is provided. The apparatus has a base and a carrier which is moveable relative to the base. The apparatus includes at least three magnetic bearings, by means of which the carrier is contactlessly held at the base such that the carrier can be displaced with respect to at least one predefined direction. At least two of the at least three magnetic bearings are configured as actively controllable magnetic bearings.

The carrier, which is contactlessly mounted on the base via the magnetic bearings, can be at least excited into vibration at a fundamental frequency. The vibration excitation can occur in a forced manner via the magnetic support of the at least three magnetic bearings, in particular if the floating or contactless support of the carrier on the base were to be exposed to external interference.

The apparatus can be provided with at least one mechanical damping unit, which is fixed to the carrier or to the base and which has a damping ratio D of at least 0.1. The mechanical damping unit may cause a targeted or broadband attenuation of the vibrations of the carrier. An objective here may be the dampening of vibration excitations of the carrier in a range between 5 times to 10 times the fundamental frequency of the carrier. To achieve this, it can be sufficient to use a separate mechanical damping unit with a damping ratio of at least 0.1.

According to a further aspect of the present disclosure, a base of an apparatus for holding, positioning and/or moving an object is provided. The base includes a base body and at least two electromagnetic actuators of actively controllable magnetic bearings arranged at the base body for contactlessly holding a carrier at the base body such that the carrier is displaceable relative to the base body in a transport direction. Further, at least one damping unit is fixed to the base body.

The base body may be a stationary base body, e.g. including stationary tracks which may be fixed to a vacuum chamber. Alternatively, the base body may be movably mounted, e.g. in a vacuum chamber. For example, the base body may be a part of a rotatable rotor of a rotation module or may be a part of a track switch device which may be movable in a track switch direction.

According to a further aspect of the present disclosure, a rotation module is provided. The rotation module includes a vacuum chamber, and a rotor that is rotatably mounted in the vacuum chamber. The rotor includes a base including a base body and at least two electromagnetic actuators of actively controllable magnetic bearings arranged at the base body for contactlessly holding a carrier at the base body. Further, at least one damping unit is fixed to the base body.

According to a further aspect of the present disclosure, a carrier of an apparatus for holding, positioning and/or moving an object is provided. The carrier is configured to be contactlessly held at a base and/or is movable relative to the base via magnetic bearings, wherein at least two of the magnetic bearings are configured as actively controllable magnetic bearings. At least one damping unit is fixed to the carrier.

According to an aspect of the present disclosure, a method of operating an apparatus for holding, positioning and/or moving an object is provided. The method includes actively controlling at least two magnetic bearings for contactlessly holding a carrier at a base, and damping vibrations of at least one of the carrier and the base with at least one damping unit fixed to the carrier or to the base.

Further aspects, advantages and features of the present disclosure are apparent from the description and the accompanying drawings.

BRIEF DESCRIPTION OF THE DRAWINGS

So that the manner in which the above recited features of the present disclosure can be understood in detail, a more particular description of the present disclosure, briefly summarized above, may be had by reference to embodiments. The accompanying drawings relate to embodiments of the disclosure and are described in the following. Typical embodiments are depicted in the drawings and are detailed in the description which follows. These show FIG. 1 a schematic perspective view of an apparatus for holding, positioning and/or moving an object according to embodiments described herein, FIG. 2 a schematic view of a magnetic bearing with a control circuit including an electronics unit, FIG. 3 a diagram of a transfer function of three different damping units, which shows a normalized amplitude plotted against a vibration frequency, FIG. 4 a further diagram of a transfer function of three different damping units in phase space, FIG. 5 a further diagram of a transfer function of three different damping units with a logarithmic plot of the damping amplitude in decibels, FIG. 6 a further diagram of the vibration behaviour of the carrier in the amplitude domain against a vibration frequency plotted without a damping unit and with three different damping units, FIG. 7 a schematic diagram of the connection of two damping units to a carrier of an apparatus for holding, positioning and/or moving an object according to embodiments described herein, FIG. 8 an isolated view of the housing of a damping unit, FIG. 9 a cross section A-A through the damping unit of FIG. 8, FIG. 10 a cross section through an alternative damping unit, FIG. 11 a schematic sectional view of an apparatus according to embodiments described herein, FIG. 12 a schematic sectional view of an apparatus according to embodiments described herein, FIG. 13 a schematic sectional view of an apparatus according to embodiments described herein, FIG. 14 a schematic sectional view of an apparatus according to embodiments described herein, FIG. 15 a schematic sectional view of a rotation module with an apparatus according to embodiments described herein, and FIG. 16 a flow diagram for illustrating a method of operating an apparatus according to embodiments described herein.

DETAILED DESCRIPTION OF EMBODIMENTS

Figure 1:
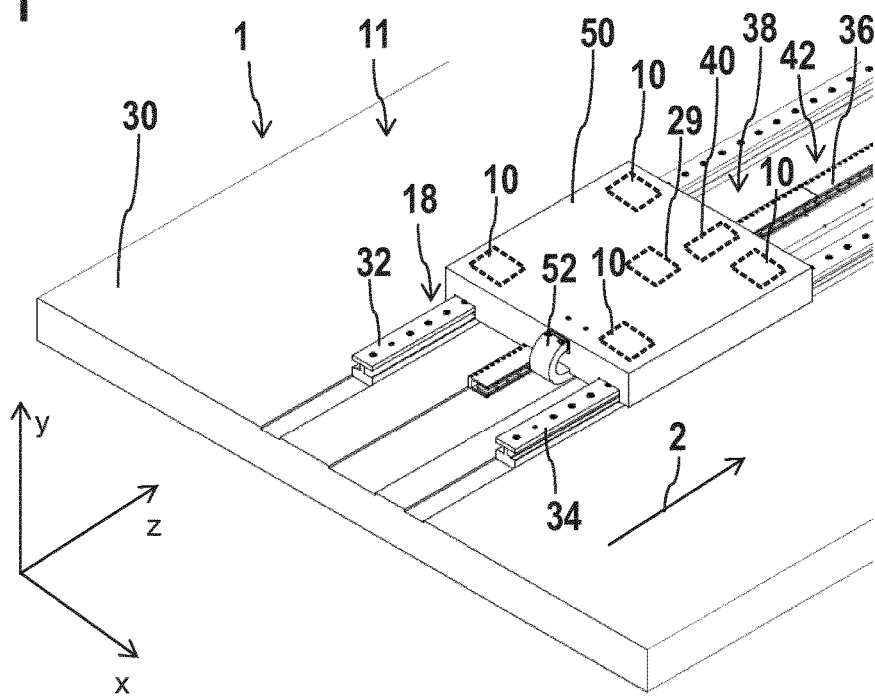

Reference will now be made in detail to the various embodiments, one or more examples of which are illustrated in the figures. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations.

Within the following description of the drawings, the same reference numbers refer to the same or to similar components. Generally, only the differences with respect to the individual embodiments are described. Unless specified otherwise, the description of a part or aspect in one embodiment applies to a corresponding part or aspect in another embodiment as well.

An apparatus provided for holding, positioning and/or moving an object according to embodiments described herein includes a base and a carrier which is moveable relative to the base. The apparatus includes at least three magnetic bearings for contactlessly holding the carrier on the base, wherein the carrier can be displaced along the base in at least one predefined direction. At least two of the at least three magnetic bearings are configured as actively controllable magnetic bearings.

The carrier, which is contactlessly mounted on the base via the magnetic bearings, can be at least excited into vibration at a fundamental frequency. The apparatus is provided with at least one mechanical damping unit, which can be fixed to the carrier or to the base. Optionally, the damping ratio D of the at least one mechanical damping unit is at least 0.1.

The damping ratio D is a dimensionless constant of the damping unit that characterizes the amount of attenuation based on a linear damped oscillator. In a spring/mass oscillator or a single mass oscillator, the degree of damping or the damping ratio can be specified as the quotient $$D = \frac{d}{2\sqrt{km}},$$

where m designates the damping mass, k a spring constant or spring stiffness, and d a damping constant. In other designs of the damping unit, the damping ratio D characterizes a factor which precedes the first derivative of the local function in the mathematical description of the oscillation.

In typical practical implementations of the apparatus for holding, positioning and/or moving an object, it is difficult to reduce or dampen vibrations or resonances of the carrier in the range between 5 times and 10 times the fundamental frequency of the carrier by the electrical control of the active magnetic bearings alone, or only with a disproportionately high technical complexity. To that extent, the frequency range between 5 and 10 times the fundamental frequency of the carrier can be considered a critical regulation range.

The contactless and magnetic mounting of the carrier on the base is characterized by at least one vibration of the carrier relative to the base with a fundamental frequency. The fundamental frequency may be the frequency of one or more rigid-body vibrations of the carrier, to which the carrier is exposed due to the contactless and magnetic mounting of the carrier on the base. The fundamental frequency can also involve the superposition of a plurality of rigid-body vibrations of the carrier.

It is also conceivable that the vibration of the carrier at the fundamental frequency comprises a superposition of multiple excited vibration modes of the carrier. At the fundamental frequency, the carrier can exclusively or predominantly vibrate in a rigid body vibration mode. The fundamental vibration mode can, however, also involve a superposition of one or more rigid-body vibrations with one or more elastic vibration modes of the carrier. The elastic vibration modes can be natural vibrations or resonance of the carrier, with which the carrier responds to an external vibration excitation.

If the carrier is mounted on the base along three different spatial directions, the carrier can undergo a total of six rigid-body vibrations, namely three translational and three rotational vibrational degrees of freedom.

The vibrations of the carrier at a fundamental frequency referred to herein can relate independently and separately from each other to each of the six fundamental frequencies or rigid-body frequencies.

The damping unit is typically designed in such a way that, in a frequency range below the critical control range, i.e. in a range between 3 to 5 times the fundamental frequency of the carrier, the damping unit has a maximum damping effect on the vibrations of the carrier. The damping unit is designed in a relatively broadband fashion, so that the damping unit also provides a substantial damping effect in the aforementioned critical control range, i.e. in the frequency range between 5 and 10 times the fundamental frequency of the carrier. Therefore, any resonance phenomena that may occur in this critical control range can be reliably attenuated via the damping unit.

The broadband damping effect provided by the damping unit allows a versatile application of the damping unit and does not require precise tuning of a main damping frequency or damping resonance frequency to the vibration system formed by the base, carrier and magnetic bearings. The mechanical damping unit can be implemented in practice with relatively inexpensive means and with comparatively little technical complexity.

A mechanical damping unit may include a damping mass, wherein a movement of the damping mass may dampen vibrations of the carrier or vibrations of the base. For example, the damping mass may be mechanically connected to the carrier such as to be movable relative to the carrier, in order to dampen vibrations of the carrier. In particular, vibrations of the carrier in a specified frequency range may induce vibrations of the damping mass relative to the carrier, wherein the vibrations of the damping mass reduce the vibrations of the carrier.

In another example, the damping mass of the mechanical damping unit may be arranged at the base such as to be movable relative to the base, in order to dampen vibrations of the base. Vibrations of the base in a specified frequency range may induce vibrations of the damping mass relative to the base such that the vibrations of the base are reduced. In particular, the mechanical damping unit may include a tuned or a tunable mass damper.

A "passive damping unit" as used herein may be understood as a damping unit which does not include an active control. For example, a damping mass may be mounted at the carrier or at the base in such a way that an induced movement of the damping mass relative to the carrier or the base naturally dampens the vibrations of the carrier or of the base. In other words, a passive damping unit does not include an actuator and/or a sensor. For example, a passive damping unit may include a damping mass connected to an oscillation system (carrier or base) by an elastic component, e.g. a spring and/or an elastic material. The elastic component and the damping mass may be adapted to the oscillation system to be damped. For example, the weight of the damping mass and a spring constant or elasticity of the elastic component may be adapted to the mass and/or to a fundamental frequency of the oscillation system.

An "active damping unit" as used herein may be understood as a damping unit which uses an active control. In particular, the active damping unit may be an adaptive damping unit. For example, the movement of an oscillation system may be actively controlled, e.g. by a respective actuator. An active damping unit may include a controller, an acceleration sensor, a velocity sensor, and/or a position sensor, and an actuator that is controlled depending on signal(s) detected by the sensor(s).

In some embodiments, the active damping unit includes a damping mass, wherein the actuator may be configured to influence a position and/or a movement of the damping mass, e.g. an oscillating movement of the damping mass.

The active damping unit including the damping mass, the actuator and the controller may be fixed the base or to the carrier.

Active damping units are more expensive, but may be flexibly utilized for dampening various oscillation systems. For example, an active damping unit can be fixed to carriers or bases of different sizes, shapes, and weights, which may have different fundamental frequencies, wherein oscillations in a respective critical frequency range can be effectively damped.

A "semi-active damping unit" may include a converter for converting an oscillation energy into an electrical energy. When the oscillation energy of the oscillation system is partially converted in electrical energy, the vibration is dampened since the oscillation system loses mechanical energy. In some implementations, the electrical energy can be dissipated as heat, e.g. by resistors.

A semi-active damping unit may include a converter for converting mechanical energy into electrical energy, e.g. a piezoelectric element connected to the oscillation system. The converter may be coupled to an electrical circuit, e.g. a resonant circuit including a coil. A resonance frequency of the resonant circuit may be adapted to one or more critical frequencies of the oscillation system. Accordingly, a vibration of the carrier or of the base can be effectively dampened.

According to an implementation, the damping unit includes a passive damper with a damping mass. Such a passive damper with a damping mass represents an unregulated damping system, which apart from an initial configuration and design, requires no adjustment or fine-tuning in the operation of the apparatus. A passive damper can also be implemented relatively inexpensively on the carrier or on the base and arranged thereon. In addition, a passive damper can provide advantages in terms of vacuum suitability. The passive damper is particularly suitable for a vacuum-tight encapsulation or for embedding into a vacuum-tight housing, which is decoupled, for example, from a controller of the magnetic bearing.

According to some implementations, the damping unit is designed as a vibration absorber. The passive damper can be either configured as a vibration absorber or may form a vibration absorber. The vibration absorber, or the passive damper can for example be configured as a single-mass oscillator which has a damping mass that is moveably mounted, at least with respect to a degree of freedom of motion about a rest position relative to the damping unit or relative to the carrier.

According to a further design, the vibration absorber has an absorber natural frequency which is between 2 times and 8 times the fundamental frequency of the carrier. The damping unit, in particular if configured as a vibration absorber, may in this case be separately tuned to the resonance phenomena and vibration phenomena expected to occur on the carrier.

According to some implementations, the vibration absorber has an absorber natural frequency which is between 3 times and 6 times the fundamental frequency of the carrier. Also, the absorber natural frequency can be between 2 and 5 times, or between 3 and 4 times, the fundamental frequency of the carrier.

In typical application scenarios, rigid-body vibrations of the carrier in the region of the absorber natural frequency are relatively benign. The actively controllable magnetic bearings can sufficiently dampen and compensate vibration excitations of the carrier in the range of the absorber natural frequency. In the case of vibration excitations in the range of 5 times to 10 times the fundamental frequency however, the electronic control of the magnetic bearings can be pushed to the limits.

The damping unit is in particular provided for damping vibrations in the critical control range, i.e. in the frequency range between 5 and 10 times the fundamental frequency of the carrier. The damping unit may however not be exactly matched to the actual frequency range to be attenuated. The absorber natural frequency is typically selected below those frequencies that are within the critical control range. However, the absorber natural frequency can also be in the frequency range of the critical control range or overlap with the critical control range.

When using a vibration absorber as a damping unit, the vibration absorber can be deliberately "detuned" in relation to the actual vibration frequencies to be attenuated. For example, the vibration absorber may not be precisely tuned to a frequency in the critical control range, but to a frequency that is below, and therefore outside of, the critical control range. If the critical control range extends, for example, from 5 to 10 times the fundamental frequency of the carrier, then the absorber natural frequency may be below that range. In such application scenarios, the absorber natural frequency may be less than 5 times the fundamental frequency of the carrier. The absorber natural frequency can, e.g., be less than 4 times or less than 3 times the fundamental frequency of the carrier.

Although the vibration absorber natural frequency can be outside the critical control range, the vibration absorber can nevertheless provide a significant attenuation of frequencies within the critical control range. The vibration absorber may produce a particularly broad-band attenuation, i.e. in a relatively large frequency range within the critical range. The vibration absorber therefore does not have to be precisely tuned to a specific vibration frequency of the carrier.

Different but also similar designs of a carrier can, depending on the structure and component or assembly tolerances, give rise to different fundamental frequencies of the carrier, in particular in the critical control range. Using the damping unit with the vibration absorber having an absorber natural frequency which is below the critical control range, the damping unit can provide sufficient damping for the magnetic support of the carrier in the critical control range for a relatively broad frequency spectrum.

Using said application and the damping unit, almost all, or at least large frequency ranges of the critical control range can be mechanically damped. It may not be necessary to separately tune, adjust or calibrate the damping unit, for example the vibration absorber, for each carrier. It is also conceivable to use the same damping unit for different carriers, wherein the carrier may have different fundamental frequencies.

According to some implementations, the damping unit has a housing, inside of which a damping mass is arranged. The housing can be vacuum-tight in some embodiments.

The vacuum-tight housing enables an arrangement of the damping unit and the carrier in a vacuum or high vacuum. The vacuum-tight housing is gas-impermeable. Any movements of the damping mass of the damping unit, which are associated with friction or a vibration, take place solely in the inside of the housing, which is hermetically isolated from the outer chamber of the damping unit.

In this way, it is possible to use damping materials or material combinations for the damping unit that would otherwise be problematic in a vacuum environment or would give rise to impurities in a vacuum environment in the region of the magnetic bearings or the apparatus for holding, positioning and/or moving an object.

By the use of a vacuum-tight enclosure or housing of the damping unit, almost any combinations of materials can be used for implementing the damping unit and the damping mass in the inside of the housing and for the suspension of the damping mass in the housing. For example, foamed materials or plastics or also elastomer materials can be used, which could otherwise be subject to outgassing in a vacuum environment and if so, would contaminate the vacuum environment.

According to some implementations, the damping mass may be moveably mounted with respect to the housing. The damping mass can be moveably mounted inside the housing. The damping mass can in particular be moveably mounted on the housing. The housing therefore acts as a base for the moveable suspension of the damping mass of the damping unit. The damping mass does not completely fill the interior of the housing. Free spaces or gaps between the housing and the damping mass can be provided with a filling material, which also facilitates a movable mounting of the damping mass.

Thanks to the mobile mounting or suspension of the damping mass inside the housing, the damping mass can be stimulated into oscillation for damping the vibrations of the carrier. The excitation of vibrations of the damping mass relative to the housing of the damping unit and the mounting of the damping unit, or the housing of the damping unit, on the carrier therefore causes a targeted damping of the vibrations or resonances of the carrier.

According to some implementations, the mounting of the damping mass on or in the housing includes at least one elastically compressible damping element and/or at least one elastically deformable mounting element. An elastically compressible damping element or a corresponding filling material can be arranged in a free space or gap between the damping mass and the housing. In that case, the damping mass can be supported via the elastically compressible damping element on an inner side of the housing. Advantageously, the damping mass is mechanically supported with opposite outer sides on opposite inner sides of the housing, e.g. in each case via an elastically compressible damping element, and therefore experiences support.

With regard to an intended vibration direction of the damping mass relative to the housing, a gap or a free space between the damping mass and the housing can be completely or almost completely filled or packed with at least one elastically compressible damping element. A vibration or movement of the damping mass relative to the housing always takes place under an appropriate elastic compression of the at least one damping element or a plurality of damping elements.

Instead of or in addition to the elastically compressible damping element, the damping mass can be mounted on or in the housing via one or more elastically deformable mounting elements. For example, the elastically deformable mounting element can include one or more springs, such as leaf springs. The damping ratio of the damping unit can be adjusted as appropriate by the elastically deformable mounting element. Appropriately configured springs can be selected for the moveable suspension of the damping mass in the housing, in order to adjust a damping ratio and/or an attenuation frequency.

It is possible for the absorber natural frequency of the vibration absorber or the damping unit to be adjusted appropriately via the at least one or more elastically deformable mounting elements.

According to another embodiment, the damping mass can be arranged at a specified distance from an inner wall of the housing. In a gap between the damping mass and the inner wall, an elastically compressible damping element can be arranged, which in an uncompressed initial state may have an outer dimension which is greater than or equal to the distance between the inner wall and the damping mass.

In some embodiments, the damping mass, in addition to the elastically compressible damping element, is movably mounted on or in the housing of the damping unit using one or more elastically deformable mounting elements. It is also conceivable that the damping mass is mounted on or in the housing only via one or a plurality of elastically compressible damping elements.

In some embodiments, the damping mass can be arranged between two layers of elastically compressible damping elements. The arrangement of the damping mass and damping elements inside the housing can be arranged in such a way that the gap between one housing wall and an opposite housing wall is almost completely filled. The arrangement of the damping mass and damping elements may be supported at least on opposite housing walls. Due to the fact that in an uncompressed initial state the elastically compressible damping element has an external dimension or external dimensions which is or are greater than or equal to the distance between the inner wall and the damping mass, it can be ensured that the elastically compressible damping element is already compressed and therefore pre-loaded when sealing the vacuum-tight housing. In this way it is ensured that the damping mass is arranged in a fixed position and under mechanical pre-loading in the interior of the vacuum-tight housing.

According to some implementations, the elastically deformable mounting element is connected with one end to the damping mass. With an opposite end, the elastically deformable mounting element may be connected to the housing. The elastically deformable mounting element can be designed as an elastically deformable spring, for example a leaf spring. The elastic deformation of the mounting element may require the application of mechanical energy, which is supplied from the vibrational excitation of the carrier. Due to the elastic deformation of the mounting element, the damping mass can be set into vibration in the intended manner.

The elastically deformable mounting element hereby fulfils a dual function. On the one hand, the elastically deformable mounting element enables a definite fixing of the damping mass in the interior of the housing. On the other hand, the absorber natural frequency or the vibration behaviour of the damping mass relative to the housing of the damping unit can be specified and defined by the elastic properties of the elastically deformable mounting element.

According to some implementations, the mounting element includes one or more leaf springs. By having a variable number of leaf springs, the vibration behaviour of the damping mass relative to the housing of the damping unit can be selectively adjusted. The leaf springs can also rest directly against each other. Mechanical friction between the leaf springs and/or friction between the spring or springs and the housing or the damping mass may be tolerable, due to the vacuum-tight design of the housing.

According to some implementations, the at least one damping unit is arranged in a cavity of the carrier that may be accessible from the outside. For example, the damping unit may be configured as a kind of drawer, which can be inserted into a correspondingly designed compartment of the carrier and/or can be attached thereto. In some embodiments, the cavity, or drawer compartment, can be recessed or integrated into an outer edge of the support. Therefore, the damping unit can be arranged on the carrier in a particularly space-saving manner and/or integrated into the carrier. The damping unit can in particular be detachably fixed to the carrier, providing a damping module. The damping unit can be placed on or removed from the carrier as appropriate. The removable arrangement of the damping unit on the carrier also allows for the exchange of a damping unit by a different type of damping unit, which can have substantially the same external dimensions but different damping characteristics.

According to some implementations, a plurality of damping units can be arranged on the carrier. For example, the carrier can have a plurality of cavities accessible from the outside, e.g. in the form of drawer compartments, each of which is configured to receive one or more damping units. In particular, a plurality of damping units may be spatially distributed on the carrier. The damping units can in particular be spatially distributed essentially evenly on the carrier. In the case of an approximately rectangular carrier, the damping units can be arranged at opposite outer sides and/or at outside corners of the carrier.

By providing a plurality of damping units, the carrier can be damped with regard to vibration excitations in an accurate way.

According to some implementations, the damping unit has a damping ratio D of at least 0.2, of at least 0.3, of at least 0.4, of at least 0.5, of at least 0.6 or of at least 0.7. The damping unit can therefore also have a damping ratio of between 0.1 and 0.7, particularly a damping ratio between 0.2 and 0.5 and more particularly a damping ratio between 0.3 and 0.4. For the dynamic system consisting of the base, actively regulated magnetic bearings and the carrier, it may be advantageous to provide a damping ratio between 0.2 and 0.5, more particularly a damping ratio between 0.3 and 0.4.

Experiments have shown that with a damping ratio of about 0.35 for an example carrier, an excellent damping result can be achieved in regard to frequencies within the critical control range, e.g. wherein the absorber natural frequency is approximately 3 to 3.5 times the fundamental frequency of the carrier.

According to some implementations, the actively controllable magnetic bearings each have an electrically controllable electromagnetic actuator, magnetically interacting with a counterpart, wherein said actuator can be actively regulated or controlled via an electronic unit to maintain a specified distance between the base and the carrier.

Perturbations of the bearing balance can be compensated by the active control of the at least two active magnetic bearings. When implementing two active magnetic bearings, the third magnetic bearing can be designed as a passive magnetic bearing. This can include, e.g., one or more permanent magnets, via which a constant supporting force can be generated between the base and the carrier in the area of the bearing. However, all of the magnetic bearings can also be designed as active, i.e. electrically controllable, magnetic bearings.

The electromagnetic actuator, for example in the case of a varying distance between the actuator and the counterpart, can be energized with a correspondingly larger or smaller, modified control current. For maintaining a distance between the carrier and the base, the relevant actuator exerts a higher or lower, hence a modified force, on the counterpart. In some embodiments, the at least two electromagnetic actuators of the magnetic bearings can be arranged on the carrier together with the electronics unit. This allows for short signal paths to be implemented, so that the vacuum capability of the carrier can be increased in comparison to other forms with electrical components that are extensively distributed on the carrier and on the base.

While the electromagnetic actuators of the at least two controllable magnetic bearings are typically arranged on the carrier, the counterparts which can be brought into magnetic interaction with the electromagnetic actuators can be located on the base. A reverse arrangement of actuators and counterparts on the carrier and on the base is equally conceivable. Therein, the electromagnetic actuators of the at least two controllable magnetic bearings are arranged at the base, and the counterparts can be arranged at the carrier.

The counterparts are typically designed as permanent magnets or ferromagnets. The number of magnetic bearings to be provided is not limited to only three magnetic bearings. The number of the magnetic bearings can vary, in particular, with the number of degrees of freedom of movement to be realized. With at least three spatially separated magnetic bearings, the carrier can be held in a stable position on the base against the force of the weight of the carrier. The floating and contactless mounting of the carrier on the base can be provided, in particular, for transport purposes, for example for a linear motion of the carrier relative to the base. In this case, at least one other or a plurality of other magnetic bearings can be provided for the lateral stabilization of the carrier on the base. By those other magnetic bearings, for example, a contactless magnetic support can be implemented in the plane perpendicular to the weight force, or perpendicular to the weight force and perpendicular to the direction of transport.

For a lateral or transverse stabilization of the carrier on the base, one or more actively controllable magnetic bearings can be provided, whose electromagnetic actuators can be arranged on the carrier and/or on the base.

The apparatus for holding, positioning and/or moving an object has, in particular, a substrate holder arranged on the carrier. By moving the carrier relative to the base, a carrier-mounted substrate can be brought into a working or processing area of a treatment device, typically a surface treatment device. The positioning accuracy of the carrier relative to the base can be in the range of a few microns or even in the sub-micron range, i.e. in the nanometer range. Instead of or in addition to a substrate holder, a processing station, e.g. a vaporizer or a comparable surface treatment device, can be arranged on the carrier.

In some embodiments, the carrier is a substrate carrier configured to carry a substrate. The carrier may include a substrate holding surface and a substrate holding device configured to hold the substrate at the substrate holding surface, particularly in an essentially vertical orientation. The substrate holding device may include a chucking device, e.g., a magnetic or electrostatic chuck.

According to some implementations, the actively controllable magnetic bearings on the carrier each include a distance sensor for measuring a distance between the base and the carrier. Each magnetic bearing may be assigned at least one distance sensor for determining the distance from the magnetic bearing to a section of the base directly opposite thereto. The distance sensor may be arranged on the carrier in the immediate vicinity of the electromagnetic actuator of the associated magnetic bearing. A small distance between a distance sensor and an electromagnetic actuator is advantageous, in particular for reducing a degree of collocation. The distance sensor can also be spaced apart from the electromagnetic actuator on the carrier, in which case the distance sensor may be arranged outside of the magnetic bearing.

The distance sensor can measure the distance at the position of the carrier which is fitted with an electromagnetic actuator. A change in the control current of the electromagnetic actuator and a resulting force or action change of the actuator thus has a direct impact on the distance between the actuator and the base-side counterpart. Such a distance change is directly measurable by the arrangement of the distance sensor adjacent to the electromagnetic actuator.

By each actively controllable magnetic bearing being fitted with a distance sensor, local distance changes between the base and carrier in the area of the respective magnetic bearing can be accurately detected and used selectively to provide the appropriate control of the respectively affected magnetic bearings.

According to some implementations, the actively controllable magnetic bearings on the carrier each have an electronics unit. The electronics unit may be used for activating the electromagnetic actuator of an associated magnetic bearing as a function of the distance measured by the distance sensor. Each magnetic bearing having an electronics unit and being fitted with a respective distance sensor, the distance signals measured by the distance sensors can be processed locally by the respective electronics units intrinsic to the magnetic bearings. Corresponding control currents or control signals for the electromagnetic actuator of each magnetic bearing can be generated locally in the area of the magnetic bearing and/or by the respective electronics unit assigned thereto. In this way, the cabling effort required between the distance sensor and electronics unit and between the electronics unit and electromagnetic actuator can be further reduced. The vacuum capability of the entire apparatus, in particular of the carrier, can be further improved and increased.

FIG. 1 is a perspective view of an apparatus 1 for holding, positioning and/or moving an object according to embodiments described herein. The apparatus 1 has a base 30 which is typically stationary and may have one guide rail or two guide rails 32, 34 arranged parallel to each other. The guide rails define a transport direction for the apparatus 1.

A carrier 50 is contactlessly supported on the guide rails 32, 34 via a plurality of magnetic bearings 10, which are actively controllable. For example, at least three magnetic bearings may be provided, wherein at least two of the magnetic bearings may be actively controllable.

Figure 2:
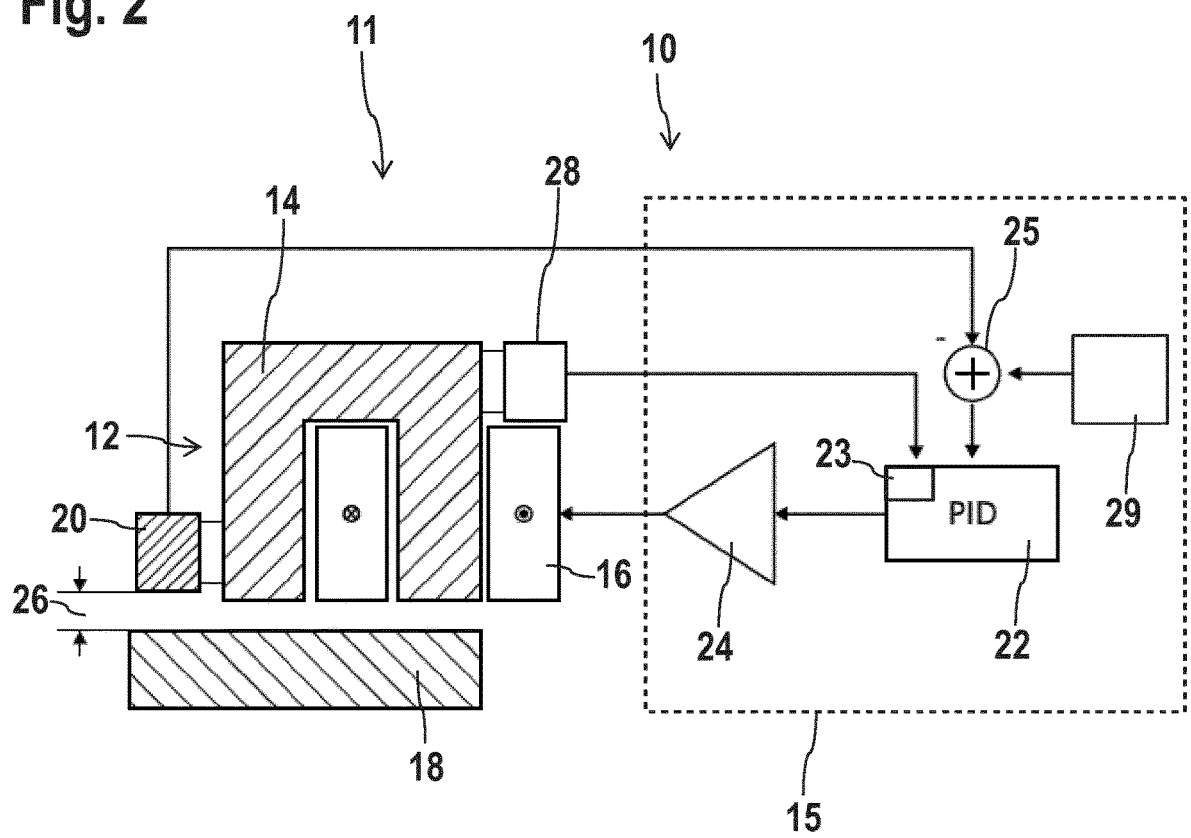

FIG. 2 shows a schematic configuration of a magnetic bearing 10.

In some embodiments, the magnetic bearing 10 may have a control circuit 11, which connects a distance sensor 20, a set-point encoder 25, a controller 22, an amplifier 24 and an electromagnetic actuator 12. The electromagnetic actuator 12 may be configured as an electromagnet. In some embodiments, the electromagnetic actuator includes a coil 16, which can be energized with electrical signals, and a ferrite or iron core 14. Instead of an electromagnet, the electromagnetic actuator 12 can be configured as a bi-directionally acting Lorentz or immersion-coil actuator. The control signals that can be generated by the controller 22 may be amplified by the amplifier 24 and may be fed to the coil 16 for generating a force acting on a counterpart 18. The counterpart 18 can be arranged on the base 30 along or on the guide rails 32, 34. The counterpart 18 can be ferromagnetic or permanently magnetic. The counterpart typically extends parallel to the guide rails, 32, 34 on the base 30.

In other embodiments, the electromagnetic actuators 12 may be arranged at the base 30, e.g. along or on a guide rail, and the counterparts 18 may be arranged on the carrier 50.

The distance sensor 20, which is typically arranged in the vicinity of the electromagnetic actuator 12, measures permanently or on a periodic basis, a distance 26 to the counterpart 18 or the carrier 50. The distance 26 measured by the distance sensor 20 is fed to the set-point encoder 25 in the form of a distance signal. This can be coupled, for example, to a central controller 29 indicated in FIG. 2, which for example supplies a set-point for the distance 26 to be maintained between the base 30 and carrier 50. The set-point and actual value are compared to each other in the set-point encoder 25 and a corresponding comparison signal is fed to the controller 22, which generates a control signal provided for controlling the electromagnetic actuator 12 and feeds the control signal to the amplifier 24.

The amplified control signal which can be finally fed to the coil 16 is calculated and defined in such a way that a specified distance 26 between the carrier 50 and base 30 is maintained and that in the case of deviations from the required distance 26, the force output by the electromagnetic actuator 12 is adjusted dynamically to maintain the distance 26.

The electronic components of the magnetic bearing 10 are in this case at least logically grouped together in an electronic unit 15. The electronic components, such as the amplifier 24, the controller 22, the set-point encoder 25, and/or the distance sensor 20 can be accommodated on a common circuit board, for example in the form of a single integrated circuit. Therefore, the space requirement for the electronics unit 15 and associated cabling can be reduced or minimized.

In the design shown in FIG. 2, a motion sensor 28 may optionally be provided on the carrier 50 or on the base 30, typically in the vicinity of the electromagnetic actuator 12. The motion sensor 28 can be integrated into the electronics unit 15 and the control circuit 11. In particular, the motion sensor 28 can be designed as an acceleration and/or velocity sensor. The acceleration sensor enables a motion state, in particular a vibration or resonance behavior of the carrier 50 and/or of the base 30, to be measured or determined.

It is possible to determine a possible vibration or resonance behavior of the base 30 and/or of the carrier 50 by the acceleration sensor arranged on the carrier 50 or on the base 30. In particular, a vibration behavior of the base and/or of the carrier can be determined by a combination of the signals determined by the acceleration sensor and the distance sensors 20. For example, if the distance sensor 20 detects a time-varying distance between base 30 and carrier 50, then this is an indication that the base 30 has been excited into vibration or otherwise mechanically perturbed, for example shaken, particularly when no motion or only a negligible small motion is detected by the motion sensor 28.

The combination of motion sensor 28 and distance sensor 20 therefore can enable the detection of perturbations and vibrations of the system, so that the magnetic bearings 10 can be selectively controlled for damping such perturbations or vibrations. The motion signal that can be generated by the motion sensor 28 can likewise be fed to the controller 22 of the control circuit 11. The motion signal can be used for damping or vibrational damping of the contactless support of the carrier 50 on the base 30. For this purpose, the controller 22 may be equipped with a vibration dampening 23, which processes the signals of the motion sensor 28 in a vibration dampening manner.

The exemplary embodiment shown in FIGS. 1 and 2 shows the arrangement of the active components of the magnetic bearings 10 on carrier 50, while the counterpart 18 or the plurality of passive counterparts is or are arranged on the base 30. The counterpart 18 may be a passive component.

It is equally provided according to further embodiments, that the active components of the magnetic bearings 10 are arranged on the base 30 and that the passive components of the magnetic bearings 10, particularly the counterpart or counterparts 18, are arranged on the carrier 50 which is movable relative to the base 30.

For example, the electromagnetic actuators 12 with the coils 16 and the associated distance sensors 20 with the electronics unit 15, the controller 22, the vibration dampening 23, the amplifier and/or the set-point encoder 25 may be arranged in a stationary way on the base 30. The counterpart or counterparts 18 may be arranged on the carrier 50.

The use of a motion or acceleration sensor, possibly in combination with a vibration dampening 23, is provided only as an option. Instead of or in addition to the vibration damping by the motion or acceleration sensor and the electronic vibration dampening, the apparatus 1 can be provided with at least one damping unit 100, as is explained further in relation to FIGS. 3-10 below.

As schematically shown in FIG. 1, a plurality of magnetic bearings 10 may be distributed over the carrier 50 and/or over the base 30. Each of the magnetic bearings 10 can have a respective control circuit and thus also a respective electronics unit. This enables each of the magnetic bearings 10 quasi-autonomously to maintain a specified distance 26 between the base 30 and carrier 50.

The apparatus 1 can be equipped with a drive 38, which can provide at least one contactless linear movement of the carrier 50 relative to the base 30. The drive 38 is designed in particular as a linear motor. In particular, the drive may include a drive rail 36, e.g. in the exemplary embodiment of FIG. 1 extending between the side guide rails. The drive rail 36 can be equipped with a permanent magnet arrangement 42 or with a ferromagnetic material, with which a coil arrangement 40 arranged on the carrier 50 can magnetically interact. As many of the electrically energizable components of the drive 38 as possible may be arranged on the carrier 50. Alternatively, the electrically energizable components of the drive 38 may be arranged at the base 30.

The drive can be designed in the form of an asynchronous motor or in the form of a reluctance drive. Depending on the implementation of the drive, the drive rail 36 can be produced from a permanent magnetic or a ferromagnetic material, or similar materials. When implementing an asynchronous motor, the drive rail can also include aluminum or another metal or be manufactured from such a material.

In FIG. 1, a power supply device 52 for the carrier 50 is indicated. In the exemplary embodiment, the power supply device 52 is implemented as a cable carrier which is arranged, for example, at the other end of the base 30. The flexibly designed cable carrier allows for a contactless movement or contactless gliding of the carrier 50 along the guide rails 32, 34 of the base 30.

In some embodiments, each of the magnetic bearings 10 can have an associated own electronics unit. Alternatively, it is conceivable that the carrier 50 has a central controller 29 which, for example, is coupled with all of the magnetic bearings 10, in particular with the electronics units 15 of the magnetic bearings, for the purpose of transferring data.

Figure 7:
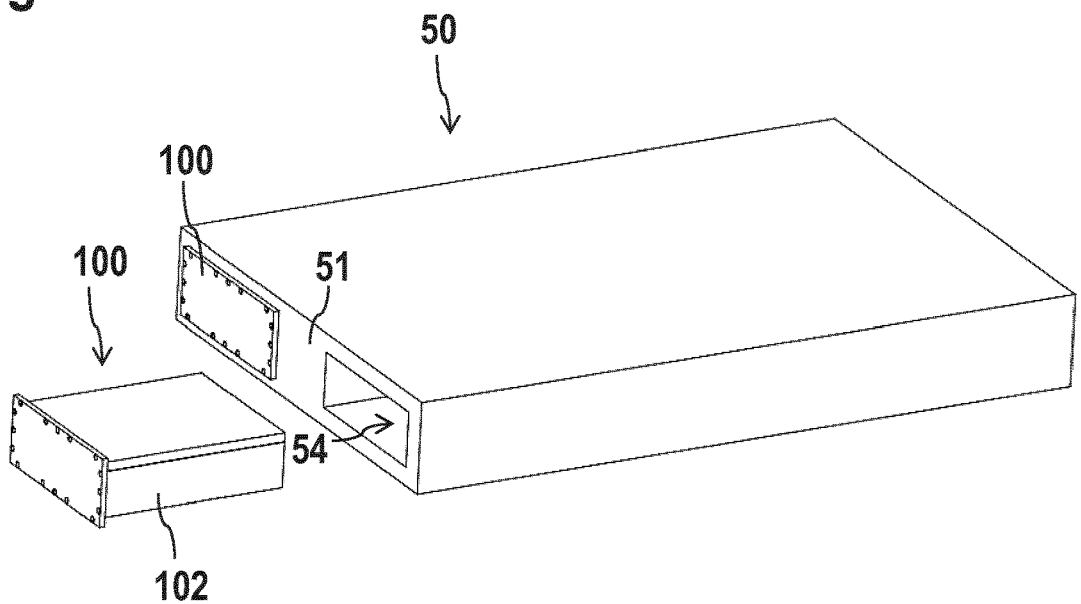

As shown in FIGS. 7-10 by way of example, the carrier 50 according to embodiments described herein may be equipped with at least one damping unit 100 which may be a mechanical damping unit. In FIG. 7, the carrier 50 may be provided with at least two or four damping units 100. The damping unit 100 is shown separately in FIG. 8.

The damping unit 100 may include a housing 102. The housing 102 can be designed closed and/or vacuum-tight. In or on the carrier 50, at least one cavity 54 may be formed for receiving the damping unit 100, or the housing 102. The cavity 54, as shown for example in FIG. 7, may be designed as an insertion slot in a side wall 51 of the carrier 50, which can receive a correspondingly designed housing 102 of the damping unit 100. In some embodiments, the damping unit 100 can be arranged directly on or in the carrier 50, without a housing 102.

The damping unit 100 may have a damping mass 112 which is positioned in the interior 104 of the housing 102. The damping mass 112 can be designed, for example, as a solid metal block, which is oscillatingly or moveably mounted in the interior 104 of the housing 102. The damping unit 100 can be designed as a passive damper 110, thus for example as a single mass oscillator or as a vibration absorber 120.

The damping mass 112 may be oscillatingly suspended in the interior 104 of the housing 102. The housing 102 in this exemplary embodiment has a cubic shape with side walls 106 oriented approximately parallel to each other. The side walls 106 are connected to each other via a rear wall 103 and via a front wall 105. The side walls 106 together with the rear wall 103 and the front wall 105 form a rectangular frame. At the bottom, the housing 102 has a base 107. At the top, the interior 104 may be closed off by a lid 108 which rests on the side walls 106.

Figure 8:
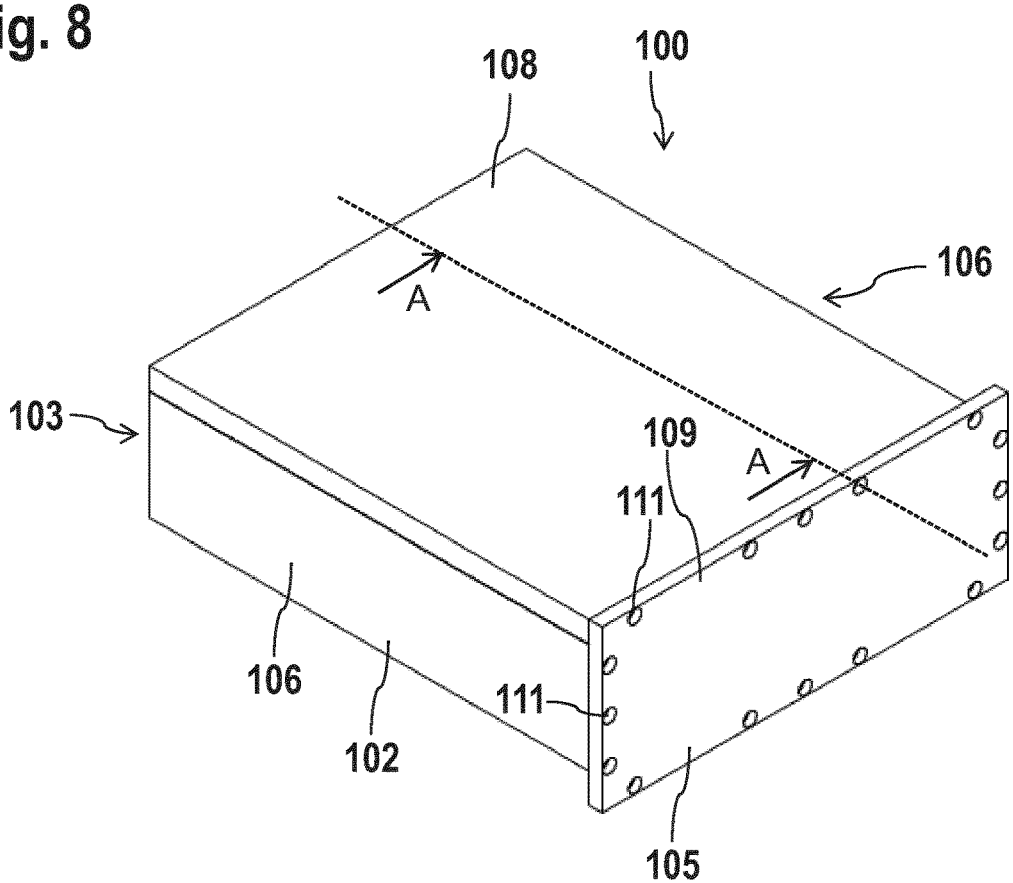

In some embodiments, the front wall 105 can extend upwards from the lid 108 as well as downwards from the base 107 of the housing 102. It is also conceivable that the front wall 105 protrudes sideways from the side walls 106. In that case, the front wall 105 can extend beyond the housing cross section in the manner of a flange, which is formed by the side walls 106, the base 107 and the lid 108. The front wall 105 can include a circumferential flange portion 109. As shown in FIG. 8, a plurality of through openings 111 may be formed in the flange portion. The housing 102 and therefore the entire damping unit can be firmly attached to an opening frame of the cavity 54 or of the corresponding slot of the carrier 50 utilizing the plurality of through openings 111.

Through the through openings, suitable fixing elements such as screws or threaded bolts can be passed, which can then engage with mating fixing means provided in the region of the opening frame of the cavity 54. The mating fixing means can be implemented, for example, as threaded holes in the carrier 50. Although not shown in FIGS. 7 and 8, on the outer side of the front wall 105, a handle can also be attached, to allow the damping unit 100 to be removed from the carrier 50.

Figure 9:
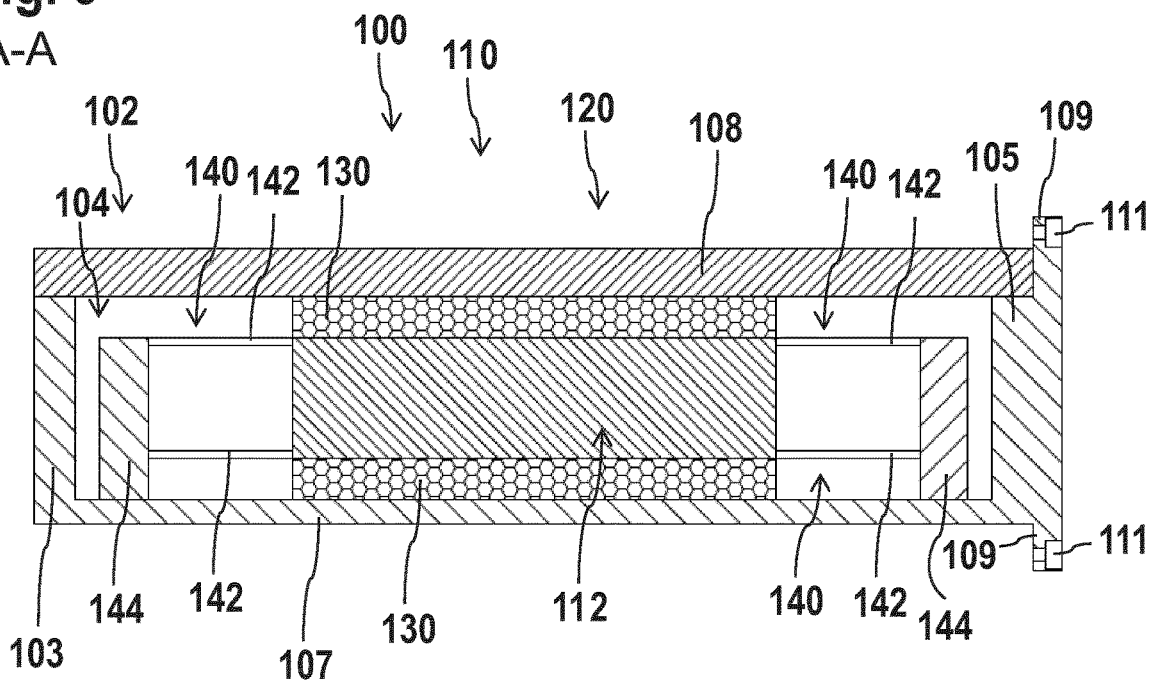

In the sectional view of FIG. 9, it is shown that the damping mass 112 may be arranged at a specified distance from the side walls 106 or the rear wall 103 and from the front wall 105. In the exemplary embodiment of FIG. 9, the damping mass 112 may be fixed to the housing 102 via elastically deformable mounting elements 140. The elastically deformable mounting elements 140 are attached to the damping mass 112 with one end. With another end, the elastically deformable mounting elements 140 may be fixed to a mounting support 144 or are connected thereto. The mounting support 144 may be arranged in a fixed position on the base 107 of the housing 102.

As is shown in FIG. 9, the damping mass 112 may be attached with each of two opposite ends to a separate mounting support via two elastically deformable mounting elements 140. Instead of the mounting support 144, it is also conceivable to fix the elastically deformable mounting elements 140 to an inner side of the rear wall 103 or the front wall 105 and to one or both of the opposite side walls.

In the exemplary embodiment shown in FIG. 9, for example, the elastically deformable mounting elements 140 are designed as leaf springs 142. It is also shown in FIG. 9 that the damping mass 112, in addition to the moveable mounting via the elastically deformable mounting elements 140, may be supported on the housing walls by at least one, in this case two, opposite damping elements 130. A first damping element is located in the gap between the base 107 and the damping mass 112. A second damping element is arranged in the gap between the damping mass 112 and the lid 108. The damping elements 130 may be elastically compressible damping elements. The damping elements 130 can, for example, be made of a plastic, a foamed material, a polymer material or elastomer material or combinations thereof.

When the lid 108 is closed, the damping elements 130 can be pre-tensioned. Via the damping elements 130, the damping mass 112 can experience an additional support on the opposite walls of the housing 102, in this case the lid 108 and the base 107. In an uncompressed initial state, the damping elements 130, which can be designed, for example, as damping mats, have a thickness or an extension which is greater than the distance between the damping mass 112 and the opposite inner wall 114, 116 of the housing 102.

Thus, mechanical vibrations of the damping mass 112 can be attenuated. Further, a vibration amplitude of the damping mass 112 can be effectively limited by the elastic properties and the compressibility of the damping elements 130.

Figure 10:
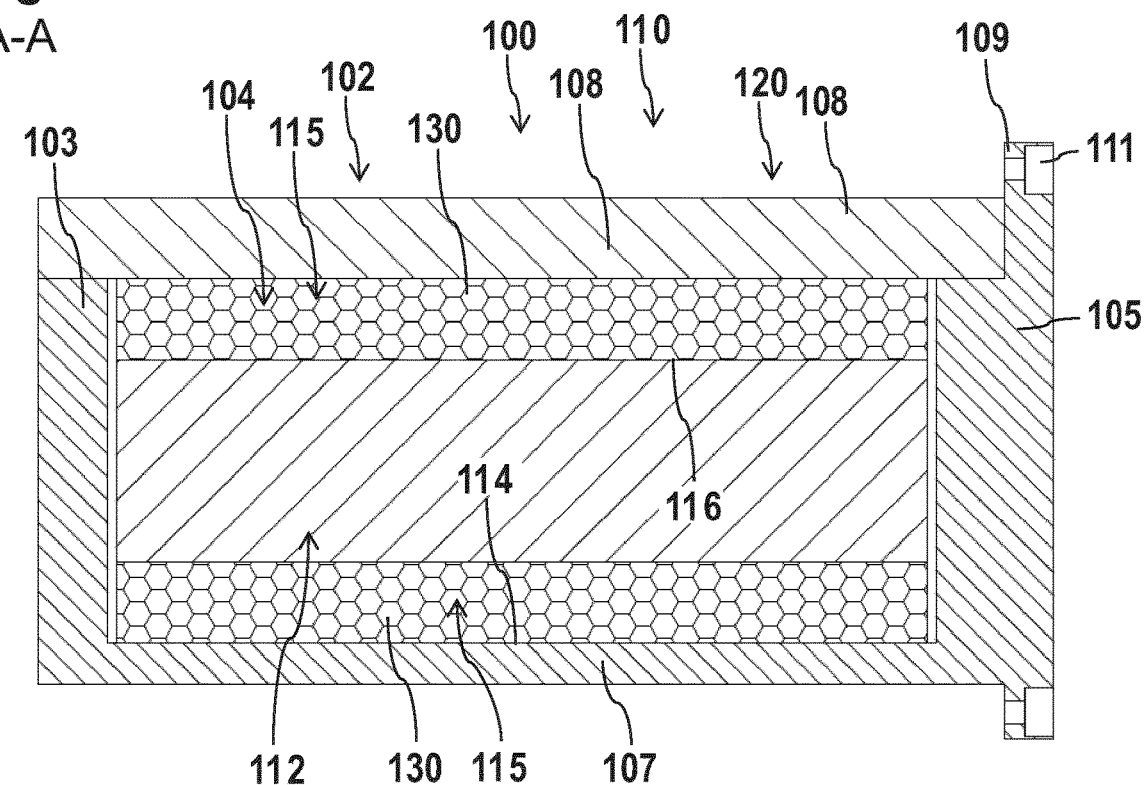

In the alternative exemplary embodiment according to FIG. 10, the damping mass 112 is mounted in the interior 104 of the housing 102 exclusively via one, two or more damping elements 130. Between an underside of the damping mass and the base 107 of the housing 102, a lower damping element is located. Opposite, i.e. between the top of the damping mass 112 and the lid 108, an upper damping element can be provided.

A gap 115 between the damping mass 112 and the opposite inner walls 114,116 of the lid 108 and base 107 is almost completely filled by the damping elements 130. The damping element 130 in the uncompressed initial state has a greater extension or a greater thickness than the gap 115 between the top of the damping mass 112 and the inner wall of the lid 108. The same applies to the thickness of the lower damping element 130 in relation to the gap 115 between the bottom of the damping mass 112 and the inner wall 114 of the base 107. In this way, it is ensured that the damping mass 112 is not arranged loosely in the interior 104 of the housing 102, but that a motion of the damping mass 112 induced by external vibrations always requires an elastic deformation of the damping elements 130.

Finally, FIGS. 3-6 illustrate the principle of operation of the damping unit 100 in an example. The damping unit 100, which in this exemplary embodiment is designed as a vibration absorber 120, has an absorber natural frequency Tf0, which is between 2 times and 8 times the fundamental frequency f0 of the carrier 50. In this exemplary embodiment, the absorber natural frequency Tf0 is roughly 3 times the fundamental frequency f0 of the carrier 50. In a practical exemplary embodiment, the fundamental frequency of the carrier can be, for example, 15 Hz or 30 Hz. Accordingly, the absorber natural frequency TF0 is approximately 45 Hz or 90 Hz. For typical application scenarios, the absorber natural frequency can be below 100 Hz.

The damping unit 100, or the vibration absorber 120, can be designed accordingly. The weight of the damping mass 112 and the moveable suspension or mounting of the damping mass 112 in the interior 104 of the housing 102 is selected such that the damping unit 100 always has a required absorber natural frequency.

Figure 3:
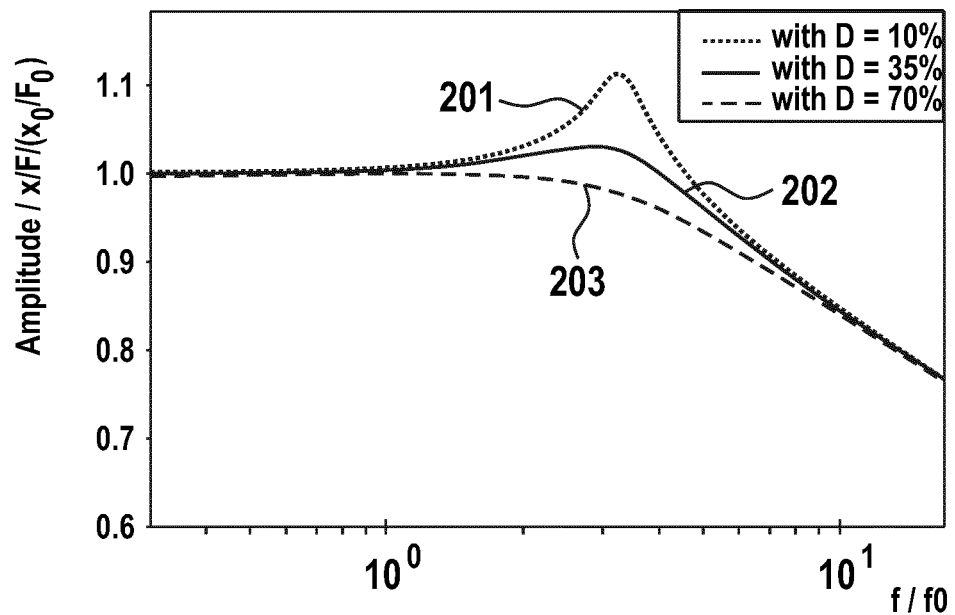

In the diagram of FIG. 3, the isolated damping effects of the mechanical damping unit are shown for three different damping ratios D. The dashed line 203 corresponds to a damping ratio D of 0.7, the solid line 202 corresponds to a damping ratio D of 0.35 and the dotted line 201 represents a damping ratio of 0.1. The vertical axis represents a normalized vibration amplitude. The horizontal axis represents an excitation frequency normalized to the fundamental frequency f0 of the carrier. It is clearly shown in the diagrams that with a relatively low damping of D=0.1, the amplitude of the vibration increases up to 2.3 times from f0, but falls off sharply at higher frequencies. For a damping ratio D of 0.35, a slight increase in the vibration amplitude is obtained for excitation frequencies above f0.

Thereafter and for higher frequencies, the amplitude also falls off significantly. With an even stronger attenuation with a damping ratio D of 0.7, for vibration excitations above the fundamental frequency f0 of the carrier 50, there is no increase in the vibration amplitude. The corresponding graph (the dashed line 203) asymptotically approaches the other two graphs.

Figure 5:
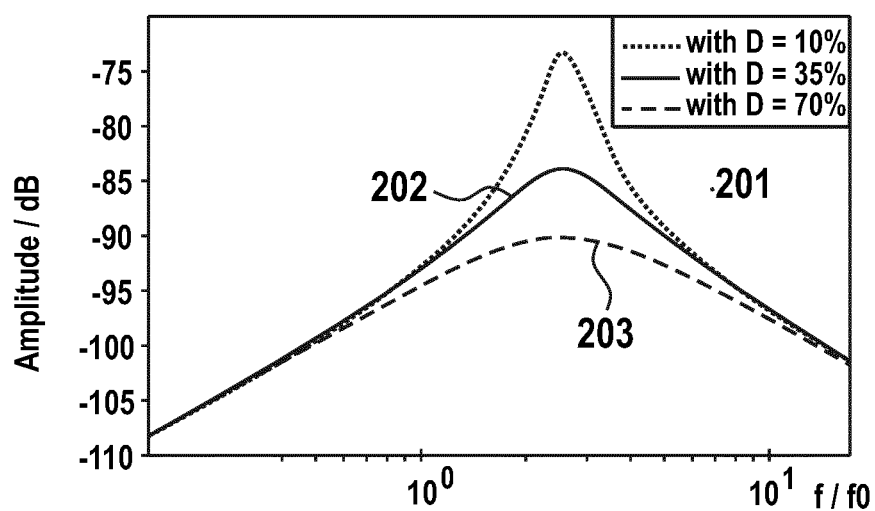

The illustration of FIG. 5 shows a very similar qualitative characteristic. In this case, however, the amplitude scale is expressed logarithmically in decibels and assumes an absorber natural frequency of approximately 45-48 Hz. The fundamental frequency f0 of the carrier 50 in this exemplary embodiment is 15 Hz. FIG. 5 shows that the different damping ratios D of 0.1, 0.35 or 0.7 have different magnitudes of effects on the vibration amplitude of the carrier.

Figure 4:
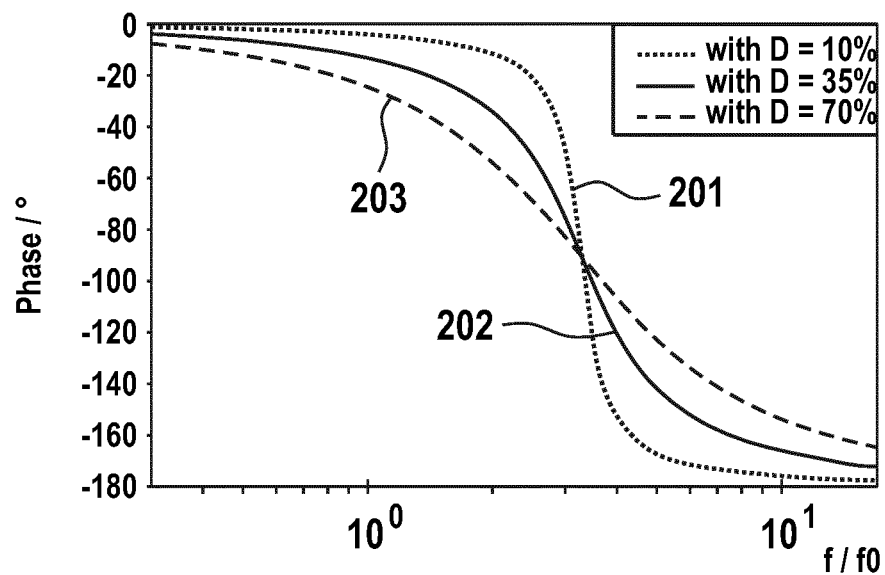

In FIG. 4, for the sake of completeness a phase diagram is shown. Here the frequency is plotted on the X-axis and again normalized to the fundamental frequency f0 of the carrier 50. It can be seen here that in the region of the absorber natural frequency Tf0, the damping units vibrate with a phase shift of approximately 90° relative to the excitation. With increasing frequencies, the absorber, or the damping mass 112 of the absorber, vibrates with a phase offset of almost 180° relative to the excitation.

Figure 6:
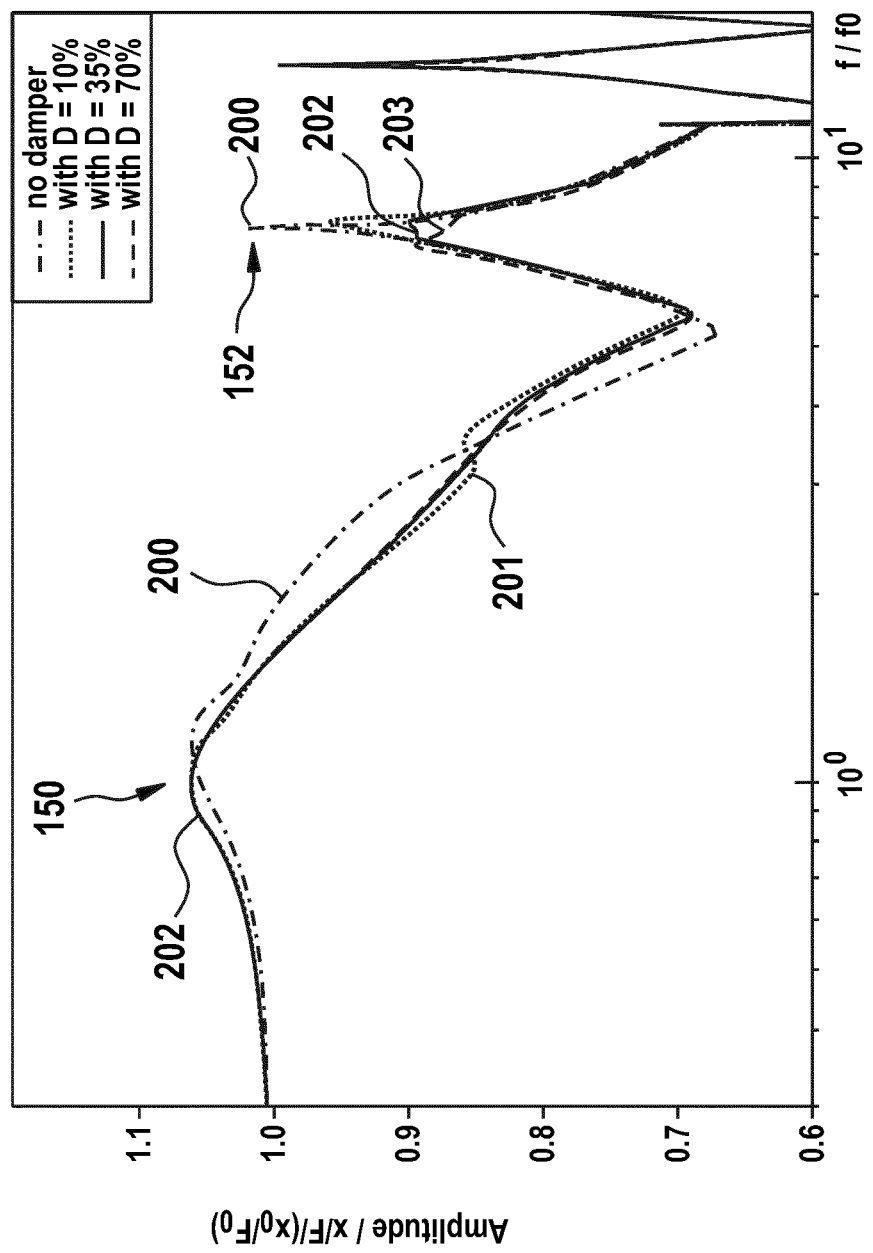

Finally, FIG. 6 shows an example of the effect of the different damping units on the vibrations of the carrier 50. The dashed-dotted line 200 shows the vibration characteristic of the carrier 50 without a damping unit. It can be clearly identified that the vibration has a first maximum 150 in the region of the fundamental frequency f0 of the carrier. With increasing frequency, up to approximately 5 times the fundamental frequency f0, the vibration amplitude decreases significantly. Thereafter however, there is a steep rise and the graph shows a second maximum 152, which is at approximately 6.5 times the fundamental frequency f0. Assuming a fundamental frequency of approximately 15 Hz, the second maximum 152 occurs at a frequency of approximately 100 Hz. For the sake of simplicity, let the frequency of the second maximum 152 be designated hereafter as the second resonance frequency.

In this frequency range, resonances and oscillations of the carrier 50 can no longer be compensated, or for the intended applications are usually only insufficiently compensated, by the active magnetic bearings. To obtain a significant reduction in the vibrations and resonances in this critical control range, the carrier 50 is equipped with at least one of the previously described damping units 100. Although the natural frequency of the damping unit 100 is below the second resonance frequency, the damping unit causes a noticeable damping of the vibrations in the range of the second resonance frequency.

On the basis of a comparison of the curve with a damping ratio of 0.1 (the dotted line 201) with the undamped case (the dashed-dotted line 200), it is clear that with a damping ratio of 0.1 the amplitude at the second resonant frequency is considerably smaller than in the undamped case. The shape of the curves is qualitatively similar, however.

At a damping ratio of 0.35 a further reduction of the vibration amplitude is obtained at the second resonance frequency. This is also associated with a plateauing of the solid line 202. This means that the resonance in the region of the second resonance frequency is not as pronounced as in the undamped case, or with an attenuation with a damping ratio D=0.1. A flattened shape or a plateau of the curve in the area of the second resonant frequency proves to be ultimately advantageous for the active regulation of the magnetic bearings 10.

The use of a damping unit with a higher damping ratio D=0.7 has hardly any further impact on the amplitude of the oscillation in the region of the second resonance frequency. In fact, a damping ratio D=0.7 may lead to a sharpening of the shape of the dashed line 203, which in turn tends to be disadvantageous for the magnetic bearings 10 and the electrical regulation of the magnetic bearings for the purpose of compensating vibrational excitations of the carrier 50.

For the purpose of this practical situation, a medium degree of damping in a range between 0.2-0.5, therefore in the region of 0.35, proves to be particularly suitable for the attenuation of resonances. In a different design of the system and the apparatus 1, for example with a larger or smaller carrier, and when using a different number of magnetic bearings 10, other frequency ranges of a vibration absorber natural frequency and other damping ratios may prove to be advantageous.

For all damping units 100, it follows that the absorber natural frequency of a vibration absorber 120 is to be beneficially selected below the second resonant frequency and below the critical control range of the magnetic bearing. Therefore, a vibration absorber 120 is used, which is detuned with respect to the frequency actually to be attenuated, namely the second resonance frequency. This ultimately has the advantage that the vibration absorber 120 does not have to be tuned exactly to the resonance frequency to be damped, but that the very same vibration absorber can be used for a multiplicity of carriers 50 which exhibit a similar but not identical vibration behaviour.

According to an aspect described herein, an apparatus 1000 for holding, positioning and/or moving an object is provided. The apparatus 1000 may include some features or all the features of the above described embodiments, such that reference can be made to the above explanations, which are not repeated here.

Figure 11:
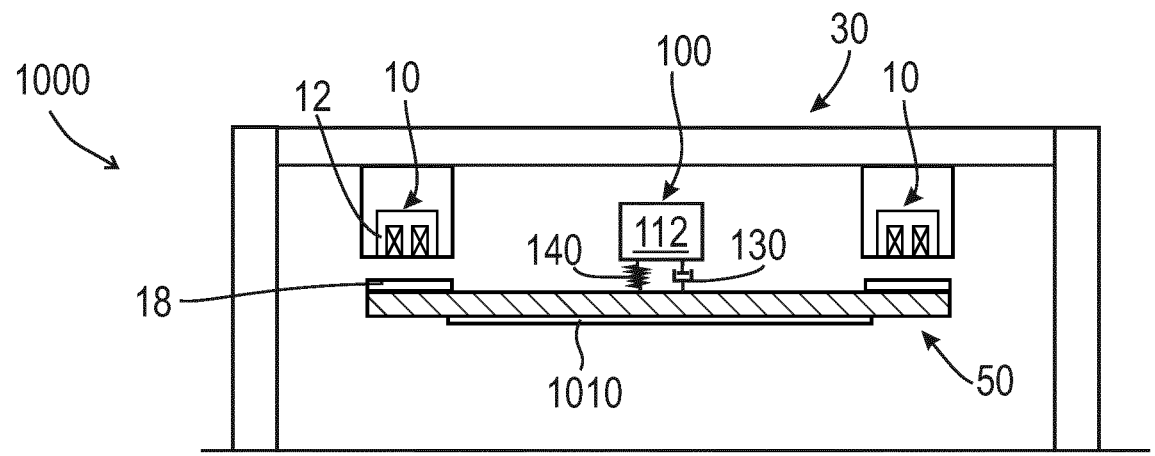

FIG. 11 shows an exemplary embodiment of the apparatus 1000. The apparatus 1000 includes a base 30 and a carrier 50 which is contactlessly movable relative to the base 30 in a transport direction. The carrier 50 is configured to carry an object 1010, e.g. for transporting the object 1010 along a guide rail of the base in a vacuum chamber. For example, the object 1010 may be a substrate or a mask.

The carrier 50 may be a substrate carrier configured to hold a substrate, e.g. in an essentially horizontal orientation or in an essentially vertical orientation. The carrier 50 may include a chucking device, e.g. a magnetic or electrostatic chuck, configured to attract the object 1010 to a holding surface of the carrier.

Figure 12:
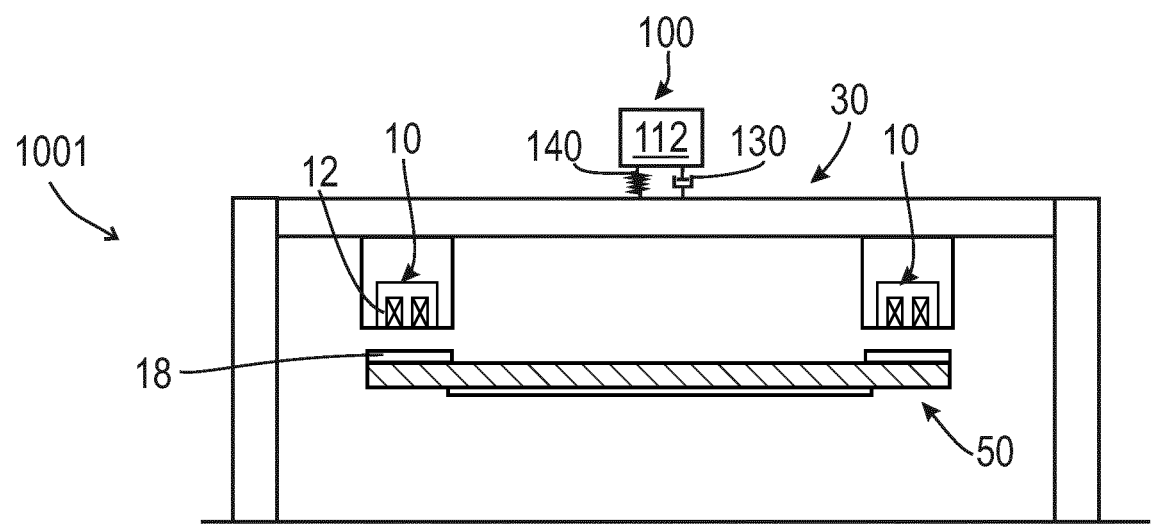
Figure 13:
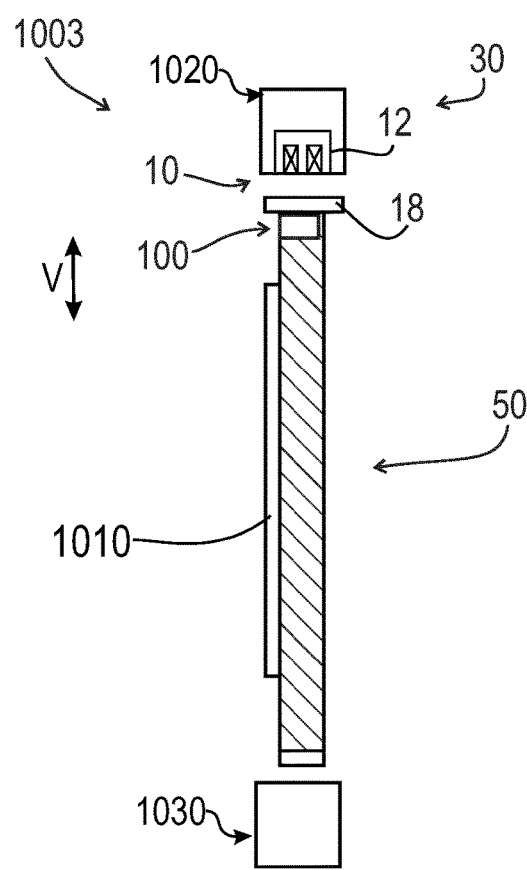
Figure 14:
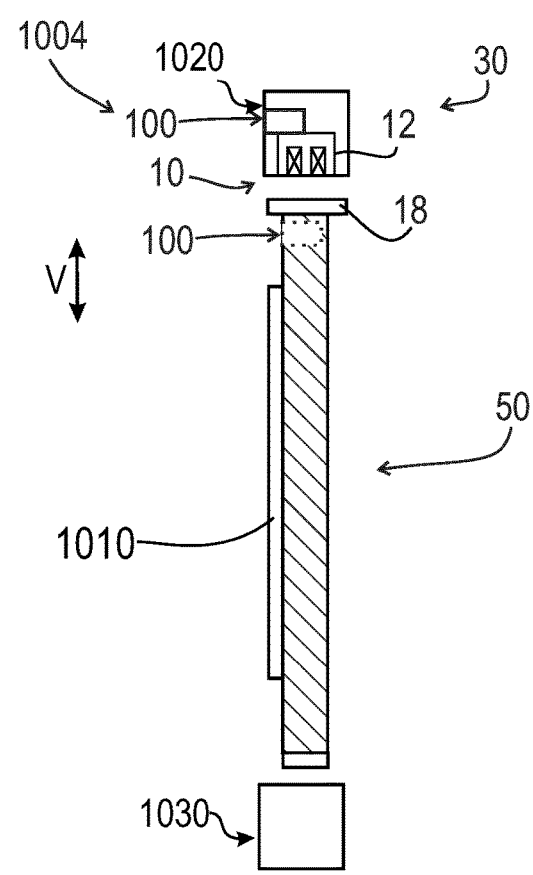

As is schematically depicted in FIG. 11 and FIG. 12, the apparatus may be configured for contactlessly holding the carrier at the base in an essentially horizontal orientation. As is schematically depicted in FIG. 13 and FIG. 14, the apparatus may be configured for contactlessly holding the carrier at the base in an essentially vertical horizontal orientation. For example, an angle between a substrate holding surface of the carrier and the gravity vector may be less than 20°, e.g. between −10° and +10°.

The apparatus 1000 further includes magnetic bearings 10 for contactlessly holding the carrier 50 at the base 30, e.g. three or more magnetic bearings 10. At least two of the magnetic bearings 10 are actively controllable. In some embodiments, the carrier 50 can be contactlessly displaced relative to the base 30 in at least one predefined direction, i.e. in a transport direction. An actively controllable magnetic bearing may include an electromagnetic actuator 12 configured to magnetically interact with a counterpart 18. The counterpart 18 may include a magnetic material. Reference is made to the above explanations, which are not repeated here.

The electromagnetic actuators 12 of the magnetic bearings 10 may be arranged at the base 30, and the counterparts 18 may be arranged at the carrier 50. For example, the base 30 may include one, two or more tracks or rails which define the transport direction for the carrier. The electromagnetic actuators 12 may be provided at the one, two or more tracks or rails. When the electromagnetic actuators 12 are provided at the base 30, the supply of the electromagnetic actuators with power and/or with cooling fluid may be easier, particularly when the base 30 is a stationary component which may be fixed to a vacuum chamber. The counterparts 18 may be provided at the carrier 50. When the carrier 50 moves along the base in the transport direction, the counterparts 18 of the carrier sequentially come into magnetic interaction with the electromagnetic actuators 12 of the base such that the carrier can be contactlessly held at the base during the transport of the carrier.

In other embodiments, the electromagnetic actuators 12 of the magnetic bearings 10 may be arranged at the carrier 50, and the counterparts 18 may be arranged at the base 30. In this case, costs and complexity can be reduced, since a limited number of electromagnetic actuators 12 at the carrier 50 is typically sufficient for a transport of the carrier along the base 30. The electromagnetic actuators 12 are typically more expensive and complex than the counterparts 18 which are typically passive components.

The apparatus 1000 further includes at least one damping unit 100 which may be fixed to the carrier 50. In particular, the at least one damping unit 100 may be a mechanical damping unit including a damping mass which may be movably arranged at the carrier 50 or in a cavity provided in the carrier. Oscillations of the carrier can be dampened.

In some implementations, the at least one damping unit 100 may be a tuned or a tunable vibration absorber. Accordingly, vibrations of the carrier in a predetermined or adjustable frequency range can be damped by tuning the vibration absorber or by utilizing an appropriately tuned vibration absorber.

The at least one damping unit 100 may be a passive damping unit, an active damping unit, or a semi-active damping unit according to any of the embodiments described herein.

In the alternative embodiment of FIG. 12, an apparatus 1001 is shown which is similar to the apparatus of FIG. 11. Here, the at least one damping unit 100 is fixed to the base 30. In particular, the damping unit 100 may be a mechanical damping unit including a damping mass which may be movably mounted at the base 30, e.g. in a respective housing. Oscillations of the base can be dampened.

In some embodiments, which may be combined with other embodiments described herein, the damping unit 100 is arranged at the base at a distance of 50 cm or less, or 20 cm or less, from an actively controllable magnetic bearing. For example, a distance between an electromagnetic actuator 12 provided at the base 30 and the damping unit 100 fixed to the base may be 20 cm or less, particularly 10 cm or less, more particularly 5 cm or less.

It is to be noted that oscillations of the movable carrier are typically more problematic and more difficult to handle than oscillations of the base 30. For example, the base 30 may include a base body constructed in a heavyweight and stable way and/or may be fixed to a vacuum chamber, particularly when the base is a stationary component that includes stationary tracks or rails for guiding the carrier through the vacuum chamber. A fixedly mounted and/or heavyweight base tends to vibrate less than a movable and/or lightweight component such as the carrier.

However, in some applications, oscillations of the base 30 may be difficult to handle. For example, it may not always be possible to structurally strengthen the base and/or to fix the base to a stationary component. Further, the base is not always a stationary component but may be movably mounted. For example, the base may include a base body including tracks or rails which may be movably mounted in a vacuum chamber. Sometimes, it may be beneficial to reduce the weight of the base, e.g. for cost reasons or with view to space requirements in a vacuum system. Accordingly, fixing a damping unit 100 to the base 30, e.g. in the vicinity of a magnetic bearing 10, may be beneficial for reducing vibrations and/or for eliminating oscillation peaks of the base 30.

The damping unit 100 fixed to the base 30 may be configured in a similar or in an identical way as any of the damping units 100 described herein, such that reference can be made to the above embodiments, which are not repeated here. For example, the damping unit 100 may be a mechanical damping unit, a passive damping unit, an active damping unit, a semi-active damping unit, a tuned or tunable mass damper and/or an oscillation damper.

In particular, the damping unit 100 may be a mechanical damping unit, particularly a passive damping unit. In particular, the damping unit may be a vibration absorber including a damping mass.

When the damping unit 100 is fixed to the base, the damping unit 100 may have an absorber natural frequency, which may be adapted to the critical frequency range, i.e. a frequency range corresponding to 2 times to 10 times the fundamental frequency of the carrier. For example, the absorber natural frequency may be between 3 times and 5 times the fundamental frequency of the carrier.

In some embodiments, which may be combined with other embodiments described herein, the damping unit 100 is a vibration absorber including a damping mass that is connected to the carrier 50 (see FIG. 11) or to the base (see FIG. 12) via at least one damping element and/or via at least one elastic element.

The at least one damping element 130 may be an elastically deformable damping element. For example, the elastically deformable damping element may include an elastic material acting between the damping mass 112 and the carrier 50 or the base 30. In particular, the elastically deformable damping element may include polyurethane or another polymer, e.g. Sylomer®.

The at least one elastic element may include an elastically deformable mounting element 140, e.g. a spring element, particularly a leaf spring. The elastically deformable mounting element 140 may movably connect the damping mass 112 with the carrier or with the base.

The damping unit 100 may be configured in accordance with the damping unit of FIG. 7 or FIG. 8. In particular, the damping unit may include a housing 102 which houses the damping mass 112, wherein the housing can be received in a cavity provided in the carrier or in the base.

In some embodiments, at least one damping unit is fixed to the carrier 50 and at least one damping unit is fixed to the base 30.

FIG. 13 shows a schematic sectional view of an apparatus 1003 for holding, positioning and/or transporting a carrier. The apparatus 1003 is similar to the apparatus of FIG. 11. However, the apparatus 1003 is configured for contactlessly holding and transporting the carrier 50 in an essentially vertical orientation. In particular, the carrier 50 that is contactlessly held at the base 30 may extend essentially in a vertical direction V.

For example, an upper track 1020 of the base 30 may be arranged at least partially above the carrier, and a lower track 1030 of the base 30 may be arranged at least partially below the carrier. Electromagnetic actuators 12 of magnetic bearings 10 provided at the upper track 1020 may magnetically interact with counterparts 18 fixed to the carrier. Accordingly, the carrier can be contactlessly held below the upper track 1020.

In some embodiments, a drive for contactlessly moving the carrier in a transport direction may be provided at the lower track 1030. For example, the drive may include a linear motor configured to contactlessly move the carrier along the base 30 in the transport direction.

In the embodiment of FIG. 13, the at least one damping unit 100 is fixed to the carrier 50, particularly in the vicinity of at least one actively controlled magnetic bearing, e.g. in an upper portion of the carrier 50. The damping unit 100 may be configured in accordance with any of the damping units described herein.

FIG. 14 shows a schematic sectional view of an apparatus 1004 for holding, positioning and/or transporting a carrier in an essentially vertical orientation. The apparatus 1004 is similar to the apparatus 1003 depicted in FIG. 13.

In the embodiment of FIG. 14, the at least one damping unit 100 is arranged at the base 30, particularly in the vicinity of at least one actively controlled magnetic bearing. The distance between the damping unit 100 and an electromagnetic actuator 12 may be 20 cm or less. Oscillations of the base in a given frequency range can be dampened by the damping unit 100.

In some embodiments, which may be combined with other embodiments described herein, a plurality of damping units 100 may be fixed to the base, e.g. spaced apart from each other in the transport direction. For example, the base may include at least one rail or track extending in a transport direction, wherein a plurality of damping units 100 may be arranged at the rail or track. For example, each electromagnetic actuator provided at the base 30 may have an associated damping unit 100 arranged in the vicinity of the electromagnetic actuator at the base. Vibrations of the base, which may be induced by a magnetic interaction between the carrier and the base can be dampened.

As is schematically depicted in FIG. 14, a damping unit 100 may optionally be fixed also to the carrier, e.g. in the vicinity of a counterpart 18 of an actively controlled magnetic bearing. In other words, at least one first damping unit may be fixed to the carrier and at least one second damping unit may be fixed to the base. The at least one first damping unit may be adapted to the oscillation properties (e.g., the mass, the fundamental frequency etc.) of the carrier and the at least one second damping unit may be adapted to the oscillation properties of the base.

According to another aspect, a base of an apparatus for holding, positioning and/or moving an object is provided. The base includes a base body, e.g. including one or more tracks or guiding rails extending in a transport direction.

The base may be a stationary component or a movably mounted component. For example, in the embodiment depicted in FIG. 15, the base is a part of a movable rotor of a rotation module configured to contactlessly hold a carrier. The rotor is rotatable with respect to a rotation axis. Accordingly, a carrier that is contactlessly held at the base can be rotated in a vacuum chamber.

At least two electromagnetic actuators of actively controllable magnetic bearings are arranged at the base body. Accordingly, a carrier can be contactlessly held at the base by at least two active magnetic bearings. The carrier can be displaced along the base in a transport direction.

Further, at least one damping unit is fixed to the base body, e.g. in the vicinity of an electromagnetic actuator, particularly at a distance of 20 cm or less from an associated electromagnetic actuator. The at least one damping unit may be configured according to any of the damping units described herein.

Figure 15:
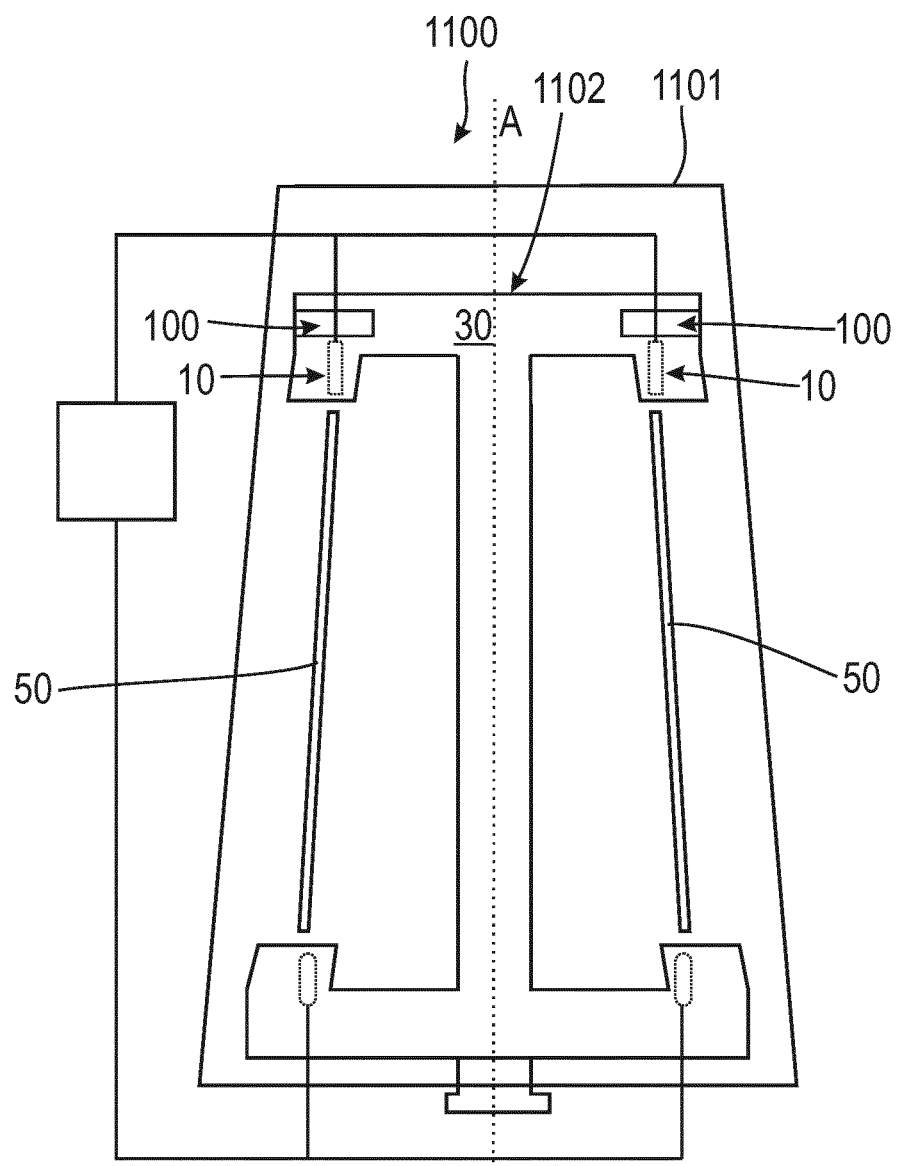

FIG. 15 is a schematic sectional view of a rotation module 1100 according to embodiments described herein. The rotation module 1100 includes a vacuum chamber 1101.

A rotor 1102 is provided in the vacuum chamber, wherein the rotor 1102 is rotatably mounted with respect to a rotation axis A, e.g. a vertical rotation axis. In other words, the rotor can be rotated around the rotation axis A. The rotor 1102 includes a base 30 according to any of the embodiments described herein.

At least two electromagnetic actuators of actively controllable magnetic bearings are arranged at the rotor such that a carrier 50 can be contactlessly held at the rotor 1102. In some embodiments, two or more carriers can be synchronously held at the rotor 1102 and/or rotated by the rotor. For example, the rotor 1102 may include at least one first track for holding at least one first carrier on a first side of the rotation axis, and at least one second track for holding at least one second carrier on a second side of the rotation axis opposite to the first side.

The base 30 may be a stationary component, or the base may be movably mounted in the vacuum chamber. For example, the base may be a part of a rotor 1102, a part of a track switch device, or a part of a carrier transfer device, which may be movable in a direction transverse to the transport direction of the carrier. For example, the base with the carrier contactlessly supported thereon may be movable in a vertical direction and/or in a horizontal direction, e.g. in a track switch direction. An actuator, e.g. a motor, for moving the base may be provided. In the case of a movably mounted base, it is beneficial to reduce the weight of the base 30. In this case, the base is not immovably fixed to a stationary component, e.g. to the vacuum chamber. Accordingly, the base 30 may be susceptible to vibrations, which may be induced by a magnetic interaction between the movable base and the carrier that is contactlessly held at the movable base. Said vibrations may be damped by the at least one damping unit fixed to the base.

In order to dampen vibrations of the rotor 1102, at least one damping unit 100 may be fixed to the rotor 1102, as is schematically depicted in FIG. 15. The natural frequency of the damping unit 100 may be adapted to the fundamental frequency of the rotor. Alternatively or additionally, the damping unit may be a tunable damping unit or an active damping unit such as an adaptive damping unit. Accordingly, vibrations of the rotor can be effectively dampened. The damping unit 100 can be configured in accordance with any of the damping units described herein, such that reference can be made to the above explanations which are not repeated here.

Figure 16:
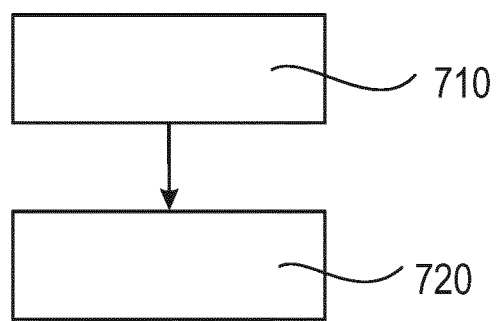

FIG. 16 is a flow diagram illustrating a method of operating an apparatus for holding, positioning and/or moving an object according to embodiments described herein.

In box 710, at least two magnetic bearings are actively controlled such that a carrier is contactlessly held at the base and/or transported with respect to the base in a transport direction. For example, the carrier can be contactlessly transported along a track or rail of the base in a transport direction, e.g. in a vacuum chamber. Alternatively or additionally, the carrier can be rotated by rotating a rotor that includes the base.

In box 720, vibrations of at least one of the carrier and the base are damped with at least one damping unit fixed to the carrier or to the base. The vibrations may be damped by the damping unit during a movement of the carrier in the transport direction with respect to the base. The vibrations may be damped by the damping unit, when the carrier is contactlessly held at the base. The vibrations may by damped during a contactless positioning of the carrier with respect to the base. The vibrations may be damped during a rotation of a rotor that includes the base, wherein the carrier is contactlessly held at the rotor. The apparatus according to embodiments described herein may be a part of a vacuum system including a vacuum chamber and at least one deposition source arranged in a deposition area in the vacuum chamber. The deposition source may be configured to deposit a coating material on an object that is held by the carrier in the vacuum system. The apparatus described herein may be configured for contactlessly transporting the carrier into the deposition area. The vacuum system may further include a rotation module for rotating the carrier, e.g. for transporting the carrier into the deposition area.

According to a first aspect described herein, an apparatus for holding, positioning and/or moving an object is described. The apparatus includes a base and a carrier which is movable relative to the base. The apparatus further includes at least three magnetic bearings, by means of which the carrier is contactlessly supported on the base such that the carrier can be displaced with respect to at least one predefined direction. At least two of the magnetic bearings are configured as actively controllable magnetic bearings and the carrier can be at least excited into vibration at a fundamental frequency. The apparatus has least one mechanical damping unit, which is fixed to the carrier and which has a damping ratio D of at least 0.1.

In some embodiments, which may be combined with other embodiments, the damping unit includes a passive damper with a damping mass.

In some embodiments, which may be combined with other embodiments, the damping unit is configured as a vibration absorber.

In some embodiments, which may be combined with other embodiments, the vibration absorber has an absorber natural frequency, which is between 2 times and 8 times the fundamental frequency of the carrier.

In some embodiments, which may be combined with other embodiments, the vibration absorber has an absorber natural frequency, which is between 3 times and 6 times the fundamental frequency of the carrier.

In some embodiments, which may be combined with other embodiments, the damping unit has a housing, in the interior of which the damping mass is arranged. The housing can be a vacuum-tight housing.

In some embodiments, which may be combined with other embodiments, the damping mass is moveably mounted relative to the housing.

In some embodiments, which may be combined with other embodiments, the mounting of the damping mass on the housing has at least one elastically compressible damping element and/or at least one elastically deformable mounting element.

In some embodiments, which may be combined with other embodiments, the damping mass is arranged at a specified distance from an inner wall of the housing, and an elastically compressible damping element is arranged in a space between the damping mass and the inner wall. In an uncompressed initial state, the damping element may have an outer dimension which is greater than or equal to the distance between the inner wall and the damping mass.

In some embodiments, which may be combined with other embodiments, the mounting element is connected with one end to the damping mass and with an opposite end to the housing.

In some embodiments, which may be combined with other embodiments, the mounting element has one or more of leaf springs.

In some embodiments, which may be combined with other embodiments, the damping unit is arranged in a cavity of the carrier that is accessible from the outside.

In some embodiments, which may be combined with other embodiments, a plurality of damping units are spatially distributed on the carrier.

In some embodiments, which may be combined with other embodiments, the mechanical damping unit has a damping ratio D of at least 0.2, of at least 0.3, of at least 0.4, of at least 0.5, of at least 0.6 or of at least 0.7.

In some embodiments, which may be combined with other embodiments, the actively controllable magnetic bearings each have an electrically controllable electromagnetic actuator, magnetically interacting with a counterpart, wherein said actuator can be actively controlled by an electronic unit for maintaining a specified distance between the base and the carrier.

While the foregoing is directed to embodiments of the disclosure, other and further embodiments of the disclosure may be devised without departing from the basic scope thereof, and the scope thereof is determined by the claims that follow.

The invention claimed is:

1. A magnetic levitation system for at least one of holding, positioning and moving an object, comprising:
    a base and a carrier which is movable relative to the base,
    magnetic bearings for contactlessly holding the carrier at the base such that the carrier can be contactlessly displaced in a transport direction, wherein at least two of the magnetic bearings are configured as actively controllable magnetic bearings, and
    at least one damping unit, which is fixed to the carrier and is configured to dampen oscillations of the carrier stimulated by the actively controllable magnetic bearings, or which is fixed to the base and is configured to dampen oscillations of the base stimulated by the actively controllable magnetic bearings,
    the damping unit being a tuned or tunable mass damper including a housing, in an interior of which a damping mass is arranged, the damping mass being movably mounted relative to the housing.

2. The system according to claim 1, wherein the damping unit is fixed to the base and is configured to dampen oscillations of the base stimulated by the actively controllable magnetic bearings.

3. The a system according to claim 1, wherein the damping unit comprises a passive damper.

4. The system according to claim 1, wherein the damping unit is configured as a vibration absorber.

5. The system according to claim 1, wherein a mounting of the damping mass on the housing has at least one of an elastically compressible damping element and an elastically deformable mounting element.

6. The system according to claim 1, wherein the damping mass is arranged at a distance from an inner wall of the housing.

7. The system according to claim 1, wherein the damping unit is arranged in a cavity of the carrier or in a cavity of the base.

8. The system according to claim 1, wherein a plurality of damping units are spatially distributed on at least one of the carrier and the base.

9. The system according to claim 1, wherein the actively controllable magnetic bearings each have an electromagnetic actuator, which is electrically controllable and magnetically interacting with a counterpart, wherein said electromagnetic actuator can be actively controlled by an electronic unit for maintaining a specified distance between the base and the carrier.

10. The system according to claim 1, wherein the damping unit is an active damping unit or a semi-active damping unit.

11. The system according to claim 2, wherein the damping unit is fixed to the base at a distance of 50 cm or less from an actively controllable magnetic bearing.

12. The system according to claim 4, wherein the vibration absorber has an absorber natural frequency, which is between 2 times and 8 times a fundamental frequency of the carrier, the fundamental frequency of the carrier referring to a vibration frequency of a rigid body vibration mode of the carrier.

13. The system according to claim 6, wherein an elastically compressible damping element is arranged in a space between the damping mass and the inner wall.

14. The system according to claim 13, wherein in an uncompressed initial state, the elastically compressible damping element has an outer dimension which is greater than or equal to the distance between the inner wall and the damping mass.

15. An apparatus for at least one of holding, positioning and moving an object, comprising:
    a base and a carrier which is movable relative to the base,
    magnetic bearings for contactlessly holding the carrier at the base such that the carrier can be displaced in a transport direction, wherein at least two of the magnetic bearings are configured as actively controllable magnetic bearings, and
    at least one damping unit, which is fixed to the carrier and is configured to dampen oscillations of the carrier stimulated by the actively controllable magnetic bearings, or which is fixed to the base and is configured to dampen oscillations of the base stimulated by the actively controllable magnetic bearings, wherein the damping unit has a housing, in an interior of which a damping mass is arranged, wherein the damping mass is movably mounted relative to the housing, wherein the damping unit is an active damping unit or a semi active damping unit.

16. The apparatus according to claim 15, wherein the damping mass is arranged at a distance from an inner wall of the housing.

17. The apparatus according to claim 15, wherein the damping unit is arranged in a cavity of the carrier or in a cavity of the base.

18. The apparatus according to claim 15, wherein the damping unit is fixed to the base and is configured to dampen oscillations of the base stimulated by the actively controllable magnetic bearings.

19. The apparatus according to claim 18, wherein the damping unit is fixed to the base at a distance of 50 cm or less from an actively controllable magnetic bearing.

* * * * *